United States Patent [19]
Ozawa et al.

[11] Patent Number: 6,044,850
[45] Date of Patent: Apr. 4, 2000

[54] SEMICONDUCTOR DEVICE MANUFACTURING METHOD INCLUDING ASHING PROCESS

[75] Inventors: Soichiro Ozawa; Satoru Mihara; Kunihiko Nagase, all of Kanagawa; Masaaki Aoyama; Naoki Nishida, both of Aichi, all of Japan

[73] Assignee: Fujitsu Limited, Kawasaki, Japan

[21] Appl. No.: 08/961,242

[22] Filed: Oct. 30, 1997

[30] Foreign Application Priority Data

Nov. 1, 1996 [JP] Japan ................................. 8-292095
Sep. 8, 1997 [JP] Japan ................................. 9-243117

[51] Int. Cl.[7] ........................ H01L 21/302; B08B 6/00
[52] U.S. Cl. .................... 134/1.1; 216/77; 216/57; 438/725; 438/734; 134/1.2
[58] Field of Search .................. 134/1.1, 1.2; 438/725, 438/715, 720, 727, 734; 216/77, 69, 57

[56] References Cited

U.S. PATENT DOCUMENTS

| | | | |
|---|---|---|---|
| 5,226,056 | 7/1993 | Kikuchi et al. | 373/18 |
| 5,397,432 | 3/1995 | Konno et al. | 156/665 |
| 5,545,289 | 8/1996 | Chen et al. | 156/643.1 |
| 5,560,803 | 10/1996 | Mihara et al. | 156/643.1 |
| 5,578,163 | 11/1996 | Yachi | 156/643.1 |
| 5,702,869 | 12/1997 | Chien et al. | 430/313 |
| 5,783,459 | 7/1998 | Suzuki et al. | 437/194 |

FOREIGN PATENT DOCUMENTS

| | | |
|---|---|---|
| 3-41728 | 2/1991 | Japan . |
| 3-280535 | 12/1991 | Japan . |
| 6-333924 | 12/1994 | Japan . |
| 6-349786 | 12/1994 | Japan . |
| WO 92/00601 | 1/1992 | WIPO . |

OTHER PUBLICATIONS

1991 Dry Process Symposium, pp. 117–122.

Primary Examiner—Benjamin Utech
Assistant Examiner—George Goudreau
Attorney, Agent, or Firm—Armstrong, Westerman, Hattori, McLeland & Naughton

[57] ABSTRACT

Ashing process of a resist pattern used in a semiconductor device manufacturing method is conducted by exposing the resist, the wirings, and their peripheral regions to a first atmosphere which includes a first product obtained by plasmanizing a gas containing water at a rate of more than 30 flow rate %, and placing the resist in a second atmosphere which includes a second product obtained by plasmanizing an oxygen mixed gas which contains an oxygen gas as a principal component before or after or before and after the exposing step.

21 Claims, 22 Drawing Sheets

① ------- before H₂O 100%
② ------ after H₂O 100%
③ —·—·— before and after H₂O 100%
④ ——··—— before and after H₂O 100% + exhaust
⑤ ———— no H₂O 100%

$H_2O : O_2 = 30 : 70$ $O_2 : H_2O = 95 : 5$

SEMICONDUCTOR DEVICE MANUFACTURING METHOD INCLUDING ASHING PROCESS

BACKGROUND OF THE INVENTION

1. Field of the Invention

The present invention relates to a semiconductor device manufacturing method and, more particularly, a semiconductor device manufacturing method including a step of ashing resist employed as a mask upon patterning a metal film.

2. Description of the Prior Art

In the case of forming wirings of a semiconductor devices, a metal film is formed as wirings by etching anisotropically a metal film which is not covered with a resist, for example, after a resist pattern is formed on the metal film including aluminum as a principal component, i.e. the aluminum-based metal film. In this etching, a gas including halogen atoms like chlorine is in general employed.

After conductive patterns are formed, the resist formed on the conductive patterns have been removed by ashing, then surfaces of the conductive patterns and their peripheral area have been processed by wet process using water or chemicals such as acid, alkali. In many cases, the gas employed in the ashing step is made of a gas which is formed by adding the water ($H_2O$), carbon tetrafluoride ($CF_4$), or the like to oxygen ($O_2$) as a principal component.

In the meanwhile, it has already been known that, if the metal film including aluminum as a principal component is dry-etched anisotropically with the use of a chlorine containing gas, chlorine atoms still remain on the surface of the metal film and its peripheral underlying surface.

Therefore, if the wafer on which the wirings are formed is taken out into the air, chlorine atoms react with moisture in the atmosphere to thus generate hydrochloric acid on the wafer. The hydrochloric acid reacts with aluminum constituting the wirings to thus cause corrosion of the wirings. This corrosion causes reduction in reliability of the semiconductor device and degradation in yielding.

In order to prevent generation of the corrosion of the wirings, various approaches have been tried until now. Several examples of such approaches will be explained herein below.

In Patent Application Publications (KOKAIs) 3-138122 and 2-80585, it has been proposed that contact between chlorine and the air can be prevented if a film such as a polymer film is formed on the surface of the wafer after the etching step or ashing step and the wafer is then taken out into the air. However, according to this approach, the etching apparatus must be equipped with a film depositing apparatus and therefore a manufacturing cost of the etching apparatus enormously goes up. In addition, maintenance process of the film deposition apparatus, e.g., cleaning process to remove trash, is needed. Besides, since the film such as the polymer film must be removed prior to succeeding steps, much time and labor are required.

In Patent Application Publication (KOKAI) 2-165656, another approach has been set forth wherein, after the etching step and the ashing step are carried out, an interlayer film such as an $SiO_2$ film can be deposited by the same apparatus without taking out the wafer into the air. This approach is effective in that regions on the wafer to which chlorine atoms are stucked are not exposed to the air. But this approach has such problems that chlorine atoms serving as the cause of corrosion still remain on the wafer and that etching residue cannot be removed by the wet process. In addition, since the interlayer film depositing apparatus must be provided to the etching apparatus, a manufacturing cost of the etching apparatus also extremely goes up.

In Patent Application Publications (KOKAIs) 3-166724 and 3-180040, another approach has been proposed wherein, after the etching step or ashing step is carried out, the wafer can be post-processed by the wet process with the use of water, organic solvent, or the like. Although the wet process is capable of having a considerable effect on removal of chlorine, exposure of the wafer to the air cannot be avoided. It may of course be considered that the wet process is conducted under vacuum, but such technique is not practical since a manufacturing cost of the apparatus would be increased extremely higher.

In addition, in Patent Application Publications (KOKAIs) 57-89477 and 4-64233, another approach has been set forth wherein, after the etching step or ashing step is carried out and before the wafer is taken out from the apparatus, a laser beam is irradiated to the wafer in the vacuum atmosphere, otherwise the wafer is heated in the vacuum atmosphere to thus remove chlorine from the wafer. However, this approach has such disadvantages that, since a laser device must be mounted on the etching apparatus or the ashing apparatus, otherwise another stage or another chamber on or in which the laser device is mounted must be provided, the apparatus becomes complicated in structure and a manufacturing cost of the apparatus is also increased higher.

On the contrary, as the chlorine removing approach which does not render the etching apparatus or the ashing apparatus complicated in structure and higher in cost, following approaches have been proposed.

In Patent Application Publications (KOKAIs) 4-259220 and 7-254589, an approach has been proposed wherein, upon ashing the resist, a step of removing chlorine from the wafer can be carried out simultaneously with the ashing step by use of a gas mixture of oxygen, methanol, and isopropyl alcohol.

Further, in Patent Application Publication 3-41728, another approach has been set forth wherein, after the ashing step is carried out by use of $CF_4$ and $O_2$, the $H_2O$ gas is supplied to the wafer without plasmanization to remove chlorine on the wafer. However, it has been reported by a literature, "Kondo et al., Proceeding of 13th Symposium on Dry Process, 10. 24, 1991" that chlorine cannot be completely removed according to this approach.

In addition, in Kondo's literature and Japanese Pat. No. 2,510,053, it has been set forth that corrosion generation can be prevented by the down-flow ashing employing $O_2$ and $H_2O$. This approach is capable of achieving a significant effect on the removal of chlorine atoms from the wafer. However, in Kondo's literature and Japenese Pat. No. 2,510,053, it has not been mentioned what influence is exerted on the prevention of the corrosion generation according to an amount of $H_2O$ gas added during the down-flow ashing employing $O_2$ and $H_2O$. Further, it has not mentioned what influence is caused on prevention of the corrosion generation and generation of the ashing residue by a combination of the down-flow ashing employing $O_2$ and $H_2O$ and the wafer heating temperature.

The $O_2/H_2O$ down-flow ashing has also been set forth in Patent Application Publication (KOKAI) 6-333924. It has been disclosed in this Patent Application Publication (KOKAI) 6-333924 that, if ultra violet (UV) cure is effected before the etching step, a deteriorated layer which is formed on the surface of the resist during the etching step does not remain as the etching residue on the wafer after the $O_2/H_2O$ down-flow ashing is completed. The deteriorated layer is formed because chlorine included in the etching gas and etched aluminum atoms are stuck respectively to the surface of the resist and than such chlorine and aluminum atoms react with the resist according to the wafer heating temperature. Unless such UV cure is effected, the deteriorated layer easily remains as the etching residue.

However, chlorine serving as the cause of corrosion is not only included in the resist residue, but also absorbed by the side wall portions of the patterned aluminum wirings, for example. Therefore, an effect of preventing the corrosion generation can be insufficiently achieved by merely preventing the generation of the resist residue. In addition, although the removal of the deteriorated layer by virtue of the UV cure has the effect of removing the chlorine, the apparatus becomes complicated in structure since a UV irradiating means has to be provided to the apparatus.

SUMMARY OF THE INVENTION

It is an object of the present invention to provide a semiconductor device manufacturing method which is able to further enhance an effect of preventing corrosion generation after ashing process without rendering an manufacturing apparatus complicated in structure.

According to an aspect of the present invention, after the metal film made of aluminum or aluminum containing material is patterned by etching with the use of the resist pattern, the resist pattern is ashed by plasmanizing the oxygen mixed gas and, before or after or before and after such ashing, the wafer is placed in the atmosphere of product derived by plasmanizing the gas which contains water at a rate of more than 30 flow rate %.

It has then been confirmed experimentally that elements such as chlorine on the wafer, which cause the corrosion, can be removed by the product derived from the plasmanized water. There are neutral activated particles (activated species), ions, electrons, etc. as the product.

The more the water containing gas includes water, the higher the effect of removing chlorine is enhanced. In the case of 100 flow rate %, the effect of removing chlorine becomes evident.

Accordingly, it has been found that the corrosion is difficult to be generated on the wirings made of the metal film. In addition, it has been apparent that the resist residue which is generated from the deteriorated layer made of metal and organic matter can be readily removed by processing the wafer by such product.

According to another aspect of the present invention, upon ashing the resist pattern, the wafer temperature is set to 130° C. or less at the time of starting the ashing and thereafter the wafer temperature is increased to 130° C. or more.

Thereby, it has then become apparent experimentally that, while suppressing generation of the deteriorated layer formed on the surface of the resist patterns, the surface of the resist patterns can be removed by ashing. As a result, generation of the residue of the deteriorated layer on the resist patterns can be prevented and release of chlorine from the wafer cannot be disturbed by the resist residue, so that generation of the corrosion due to chlorine can be suppressed. In addition, generation of trash due to the resist residue can be prevented.

If the resist patterns are ashed at the wafer heating temperature of 130° C. or less, the ashing speed becomes slow. Therefore, it is preferable that the wafer heating temperature of 130° C. or less is selected only in the initial stage of the ashing step.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1:
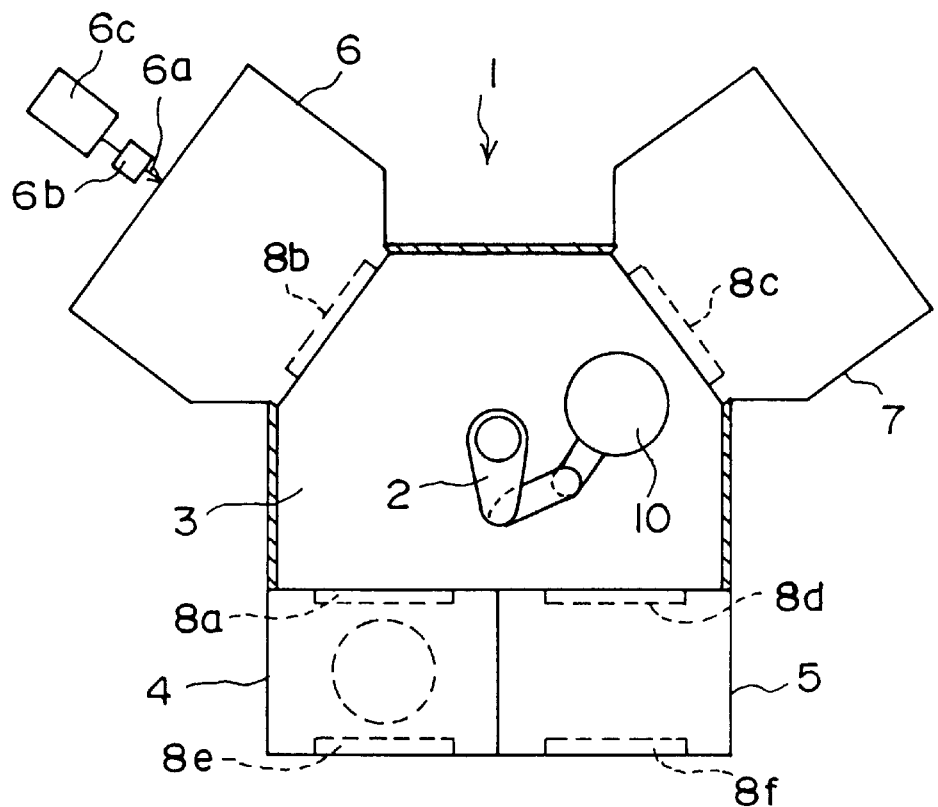
FIG. 1 is a schematic plan view showing a configuration of a sheet-feed type wafer processing apparatus for use in embodiments of the present invention.

Various embodiments of the present invention will be described with reference to the accompanying drawings. It should be noted that the same or similar reference numerals are applied to the same or similar parts and elements throughout the drawings and the description of the same or similar parts and elements will be omitted or simplified.

(First Embodiment)

FIG. 1 is a schematic plan view showing a configuration of a sheet-feed type wafer processing apparatus for use in embodiments of the present invention.

A wafer processing apparatus shown in FIG. 1 comprises a wafer carrying chamber 3 in which a wafer carrying robot 2 is installed. A load chamber 4 in which unprocessed wafers are loaded and an unload chamber 5 in which processed wafers are loaded are provided adjacently to the wafer carrying chamber 3. In addition, there are provided an etching apparatus 6 and an ashing apparatus 7 adjacent to the wafer carrying chamber 3.

Gate valves 8a, 8b, 8c, 8d are provided respectively to the connecting areas between the wafer carrying chamber 3 and the load chamber 4, the unload chamber 5, the etching apparatus 6, and the ashing apparatus 7. In addition, another gate valves 8e, 8f are provided respectively to the load chamber 4 and the unload chamber 5 on the opposite side to the wafer carrying chamber 3. Airtightness of respective chambers can be maintained individually by these gate valves 8a to 8f.

An electron cyclotron resonance (ECR) etching apparatus can be employed as the etching apparatus 6, for instance. A gas introducing pipe 6a for introducing an etching gas is connected to a chamber of the ECR etching apparatus 6. A reaction gas source 6c is connected to this ECR etching apparatus 6 via a gas introducing pipe 6a and a mass flow controller 6b.

Figure 2:
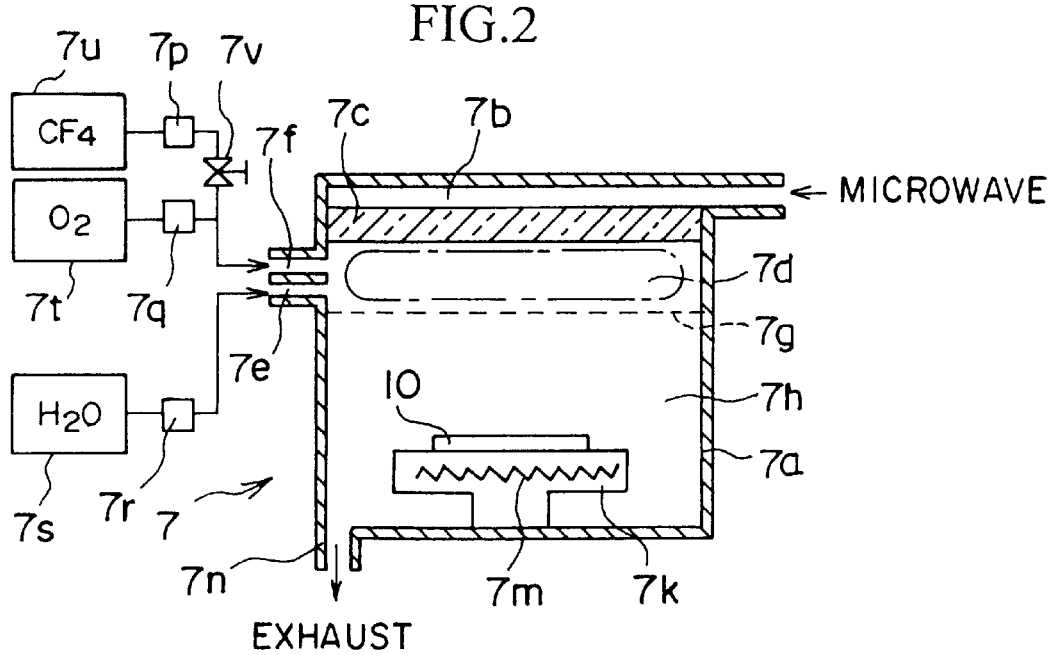
FIG. 2 is a schematic sectional view showing a configuration of a first example of an ashing apparatus for use in the embodiments of the present invention.

A microwave down-flow type ashing apparatus shown in FIG. 2 can be employed as an ashing apparatus 7, for instance.

In FIG. 2, a microwave introducing chamber 7b is formed over a chamber 7a. A plasma generating chamber 7d is provided beneath the microwave introducing chamber 7b via a diaphragm 7c made of quartz, AlN, or $Al_2O_3$. First and second gas introducing pipes 7e, 7f are connected to the plasma generating chamber 7d. The gas which is introduced into the plasma generating chamber 7d via the first and second gas introducing pipes 7e, 7f is plasmanized by microwave. In addition, a shower head 7g in which a large number of small holes of a diameter of 2 to 3 mm are formed is arranged below the plasma generating chamber 7d, and a reaction chamber 7h is arranged under the shower head 7g.

In addition, a wafer stage 7k in which a heater 7m is built in is placed on the bottom of the reaction chamber 7h. An exhausting pipe 7n is connected to the chamber 7a below the wafer stage 7k.

A $H_2O$ gas source 7s is connected to the first gas introducing pipe 7e via a mass flow controller 7r. An $O_2$ gas source 7t and a $CF_4$ gas source 7u are connected to the second gas introducing pipe 7f via mass flow controllers 7g, 7p respectively. The $CF_4$ gas source 7u is cot-pled to the plasma generating chamber 7d by opening a switching valve 7v if the $CF_4$ gas is required upon ashing.

Then, a step of forming wirings on a silicon wafer with the use of the above wafer processing apparatus 1 will be explained.

First Example of the first embodiment

The step of forming the wirings is started from formation of a metal film by a film forming apparatus (not shown).

Figure 3A:
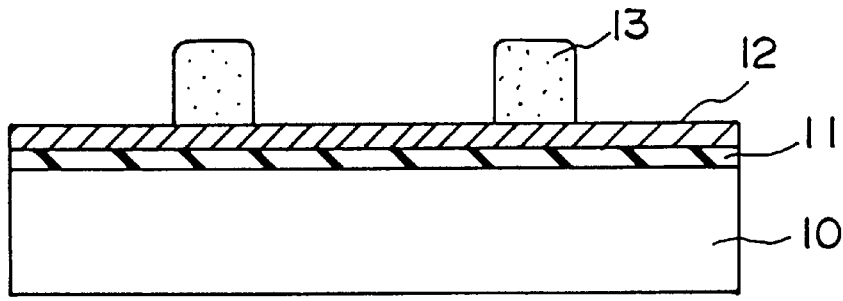
FIGS. 3A to 3D are sectional views showing a first example of a step of ashing resist in a first embodiment of the present invention.

At first, as shown in FIG. 3A, a three-layered metal film 12 made of 100 nm thick TiN/600 nm thick AlCuTi/100 nm thick TiN is formed on an insulating film 11 formed on a silicon wafer (semiconductor wafer) of 6 inch diameter. Subsequently, resist is coated on the metal film 12 to have a thickness of about 1.7 $\mu m$, and then resist patterns 13 are formed by exposing and developing the resist. Positive type i-line resist (product name: THMR-IP2100 manufactured by Tokyo Ohka Kogyo Co., Ltd.) can be employed as resist material in this example. Line and space patterns having a 0.5 $\mu m$ distance are formed as the resist patterns 13.

In turn, the silicon wafer 10 is loaded into the load chamber 4 shown in FIG. 2. The pressure of the interior of the load chamber 4 is then reduced under condition that the gate valves 8a, 8e provided on both sides of the load chamber 4 are closed. The gate valve 8a provided on the wafer carrying chamber 3 side is then opened. The silicon wafer 10 is taken out from the load chamber 4 by the robot 2 and then carried into the chamber of the etching apparatus 6 by the robot 2.

The gate valve 8b provided on the etching apparatus 6 side is then closed and chlorine ($Cl_2$), boron chloride ($BCl_3$), and argon (Ar) are then introduced into the etching apparatus 6 at flow rates of 100 sccm, 100 sccm, and 2 sccm respectively via the gas introducing pipe 6a. Under this condition, an internal pressure of a reaction chamber (not shown) of the etching apparatus 6 is kept at 4 mTorr. At this time, a temperature of the silicon wafer 10 is set to room temperature, e.g., 25° C.

Figure 3B:
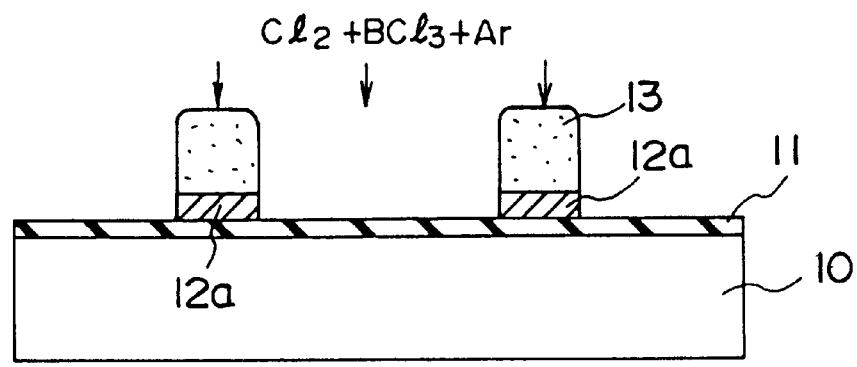

If the metal film 12 not covered with the resist patterns 13 is removed under such etching condition, the metal film 12 remains only beneath the resist patterns 13, as shown in FIG. 3B, so that the patterns of the metal film 12 constitute wirings 12a.

After such etching being completed, the gate valve 8b provided to the etching apparatus 6 is opened to take out the silicon wafer 10 from the etching apparatus 6, and then the silicon wafer is carried to the ashing apparatus 7 by the robot 2.

A temperature of the wafer stage 7k is set to 200° C. by the heater 7m to heat the silicon wafer 10. Subsequently the gate valve 8c of the ashing apparatus 7 is closed, and gaseous water ($H_2O$) is then introduced into the plasma generating chamber 7d at a flow rate of 300 sccm via the first gas introducing pipe 7e of the ashing apparatus 7, but no gas except for the gaseous water is introduced. That is to say, the gas to be supplied to the plasma generating chamber 7d includes $H_2O$ 100%. When the pressure in the plasma generating chamber 7d and the reaction chamber 7h is reduced to 1 Torr, the $H_2O$ is plasmanized by the microwave in the plasma generating chamber 7d.

Figure 3C:
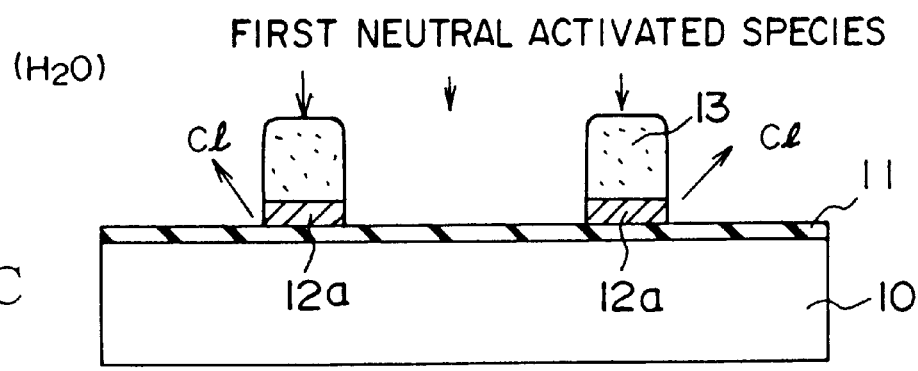

Only the neutral activated species (first neutral activated species) of plasmanized $H_2O$ are supplied through a large number of small holes formed in the shower head 7g to the reaction chamber 7h located in the downstream of gas flow. As shown in FIG. 3C, the neutral activated species are supplied to the silicon wafer 10 and the resist patterns 13 on the wafer stage 7k in the reaction chamber 7k.

Atoms of oxygen (O) and hydrogen (H) or excited molecules of water ($H_2O$) are included in the neutral activated species. Also, the activated species such as OH free radical are included in the neutral activated species.

The neutral activated species of $H_2O$ is then supplied to the silicon wafer 10 for 20 seconds, and oxygen is then supplied to the plasma generating chamber 7d at a flow rate of 1235 sccm via the second gas introducing pipe 7f. Simultaneously, the gas composed of at least $H_2O$ is also introduced into the plasma generating chamber 7d at a flow rate of 65 sccm via the first gas introducing pipe 7e. In this case, a temperature of the wafer stage 7k is kept at 200° C. and halogen is not introduced into the gas.

Figure 3D:
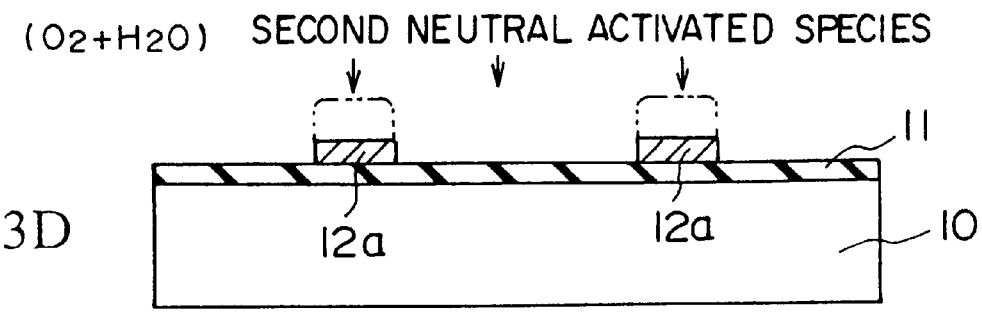

Accordingly, plasma of the gas which includes oxygen as a principal component can be generated in the plasma generating chamber 7d. Only the neutral activated species (second neutral activated species) of plasmanized oxygen and the water can be supplied to the reaction chamber 7h located in the downstream of gas flow via a large number of small holes formed in the shower head 7g. As shown in FIG. 3D, the neutral activated species are supplied to the surface of the silicon wafer 10 placed on the wafer stage 7k in the reaction chamber 7h. The resist patterns 13 on the silicon wafer 10 is then able to be ashed by reacting with the neutral activated species and thus removed.

Atoms of oxygen (O) and hydrogen (H) or excited molecules such as oxygen ($O_2$), water ($H_2O$), etc. are included in the neutral activated species. In addition, the activated species like OH free radicals are also included in the neutral activated species. Such excited molecules, activated species, etc., react with the resist. In particular, it may be supposed that the reaction of atomic oxygen (O) and excited oxygen molecule ($O_2$) With the resist is mainly caused.

After introduction of the gas mixture of $H_2O$ and $O_2$ into the plasma generating chamber 7d is continued for 80 seconds, such introduction of the gas mixture is ceased.

Next, the gas in the plasma generating chamber 7d is exhausted, then the gate valve 8c of the ashing apparatus 7 is opened to take out the silicon wafer 10 from the ashing apparatus 7 by the robot 2, and then the silicon wafer 10 is carried to the outside via the unload chamber 5.

The silicon wafer 10 is then left for 24 hours in the vapor-saturated atmosphere to accelerate the corrosion generation on the wirings 12a, and then it is checked whether or not the corrosion is generated on the surface of the wirings 12a. As a result, it has been found that four corrosions are generated in an area of about 25 $\mu m \times 20$ cm. The number of corrosion has been counted up with the eye through a microscope. The same approach will be applied in the following examples to examine the corrosion generation.

On the contrary, unless the process of introducing only $H_2O$ into the plasma generating chamber 7d is carried out, the number of corrosions generated in such area of about 25 $\mu m \times 20$ cm has become twelve.

With the above results, it has been apparent that, in the initial stage of the ashing step of the resist patterns 13, the corrosion generation can be suppressed by the neutral activated species obtained by plasmanizing $H_2O$ of 100 flow rate %.

Second Example of the first embodiment

In a second example, the same steps as those in the first example will be applied from formation of the wirings 12a to conveyance of the silicon wafer 10 into the ashing apparatus 7. However, processes in the ashing apparatus 7 will be carried out in the following.

First, a temperature of the wafer stage 7k is set to 200° C. to bring the silicon wafer 10 placed on the wafer stage 7k into a heated condition.

Then, $O_2$ is introduced into the plasma generating chamber 7d at a flow rate of 1235 sccm via the second gas introducing pipe 7f. At the same time, the gas mixture of $H_2O$ is introduced into the plasma generating chamber 7d at a flow rate of 65 sccm via the first gas introducing pipe 7e.

Figure 4A:
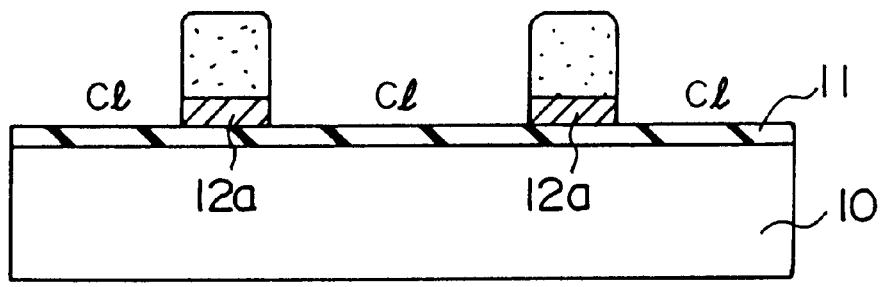
FIGS. 4A to 4C are sectional views showing a second example of a step of ashing resist in the first embodiment of the present invention.
Figure 4B:
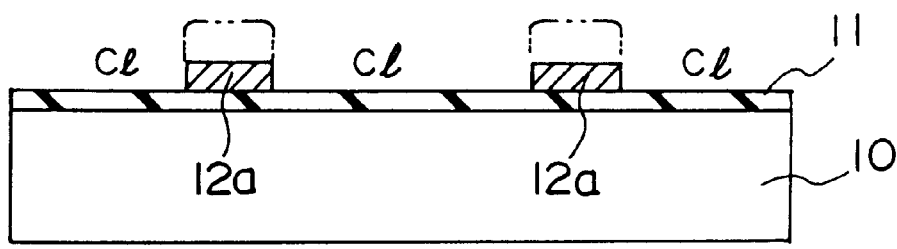

Accordingly, plasma of the gas including oxygen as a principal component is generated in the plasma generating chamber 7d. Only the neutral activated species (second neutral activated species) of plasmanized $O_2$ and $H_2O$ are introduced into the reaction chamber 7h located in the downstream of gas flow through a large number of small holes formed in the shower head 7g. On the wafer stage 7k in the reaction chamber 7h, as shown in FIGS. 4A and 4B, the neutral activated species are supplied on the silicon wafer 10, and the resist patterns 13 on the silicon wafer 10 are ashed by the neutral activated species and then removed.

Atoms of oxygen (O) and hydrogen (H) or excited molecules such as oxygen ($O_2$), water ($H_2O$), etc. may be employed as the neutral activated species. In addition, the activated species like OH free radicals may be employed as the neutral activated species. Such excited molecules, activated species, etc., react with the resist. In particular, it may be considered that the ashing by atomic oxygen (O) and excited oxygen molecule ($O_2$) is mainly caused.

After ashing of the resist patterns 13 is conducted, a temperature of the wafer stage 7k is kept at 200° C. Under this condition, supply of the $O_2$ gas from the second gas introducing pipe 7f is stopped, then only the gaseous water ($H_2O$) is introduced into the plasma generating chamber 7d at a flow rate of 300 sccm via the first gas introducing pipe 7e of the ashing apparatus 7, and then pressure in the plasma generating chamber 7d and the reaction chamber 7h is reduced to 1 Torr. Consequently, $H_2O$ can be plasmanized by the microwave in the plasma generating chamber 7d.

Figure 4C:
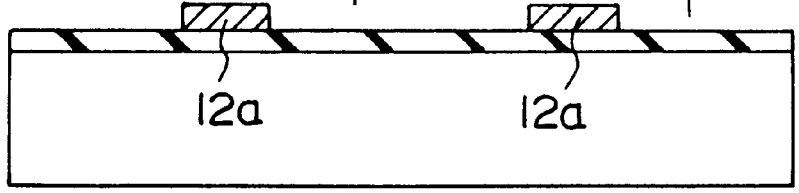

Only the neutral activated species (first neutral activated species) of plasmanized $H_2O$ are introduced into the reaction chamber 7h located in the downstream of gas flow through a large number of small holes formed in the shower head 7g. As shown in FIG. 4C, the neutral activated species are supplied to the silicon wafer 10 on the wafer stage 7k.

Atoms of oxygen (O) and hydrogen (H) or excited molecules such as oxygen ($O_2$) water ($H_2O$), etc. are included in the neutral activated species. Further, the activated species like OH free radicals are included in the neutral activated species.

Such introduction of the water into the plasma generating chamber 7d is continued for 20 seconds to exhaust the internal gas, then the gate valve 8c of the ashing apparatus 7 is opened to take out the silicon wafer 10 from the ashing apparatus 7 into the wafer carrying chamber 3 by the robot 2, and then the silicon wafer 10 is carried to the outside via the unload chamber 5.

When the corrosion generation on the surface of the wirings 12a formed on the silicon wafer 10 has been checked according to the same method as that in the first example, three corrosions have been generated in an area of about 25 $\mu$m×20 cm.

On the contrary, if the above process of introducing $H_2O$ of 100 flow rate % into the plasma generating chamber 7d is not taken as post-treatment of the ashing process, twelve corrosions have been generated in an area of about 25 $\mu$m×20 cm on the surface of the wirings 12a.

With the above results, it has become clear that, after the resist patterns 13 are removed by the ashing step, the corrosion generation can be suppressed by the neutral activated species generated by plasmanizing $H_2O$ of 100 flow rate % in the gas.

Third Example of the first embodiment

In the above-mentioned first example, before the ashing step of the resist patterns 13 by the gas mixture of oxygen and the water, only the neutral activated species of plasmanized water have been supplied on the silicon wafer 10 located in the downstream of gas flow. In contrast, in the above second example, after the ashing step of the resist patterns 13 by the gas mixture of oxygen and the water, only the neutral activated species of plasmanized water have been supplied on the silicon wafer 10 located in the downstream of gas flow.

Figure 5A:
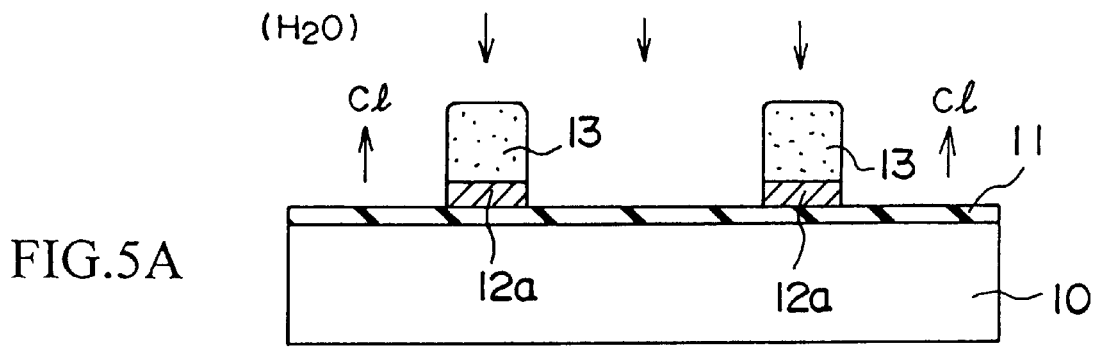
FIGS. 5A to 5C are sectional views showing a third example of a step of ashing resist in the first embodiment of the present invention.
Figure 5B:
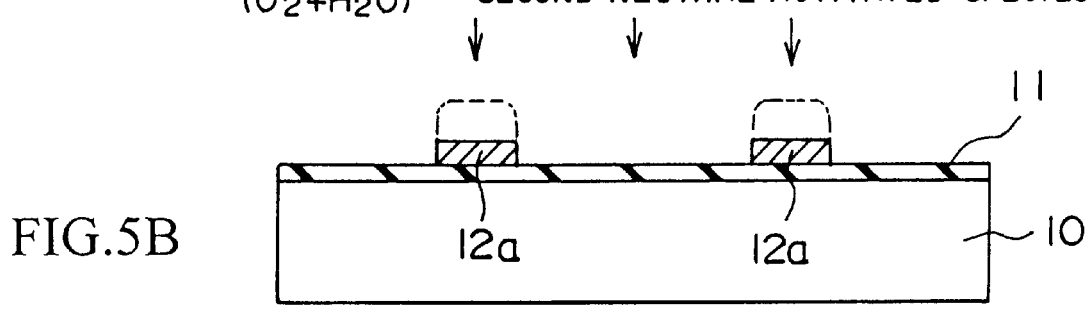
Figure 5C:
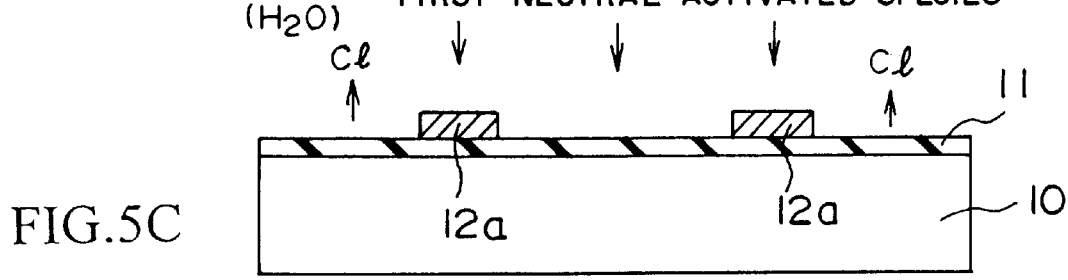

Therefore, in this third embodiment, as shown in FIGS. 5A to 5C, before and after the ashing step of the resist patterns 13, only the neutral activated species of plasmanized water are supplied on the silicon wafer 10 located in the downstream of gas flow. When the corrosion on the surface of the wirings 12a formed on the silicon wafer 10 is examined by the similar way to that in the first example after the ashing step is completed, only one corrosion has been found in an area of about 25 $\mu$m×20 cm. Hence, the effect of suppressing the corrosion generation has been enhanced higher than the first example and the second example.

In the third example, both the condition of plasmanizing the gas mixture consisting of oxygen and water to ash the resist patterns 13a by the neutral activated species in the downstream and the condition of plasmanizing the water to supply the neutral activated species to the silicon wafer 10 located in the downstream are set similarly to those in the first example and the second example respectively.

Fourth Example of the first embodiment

Figure 5D:
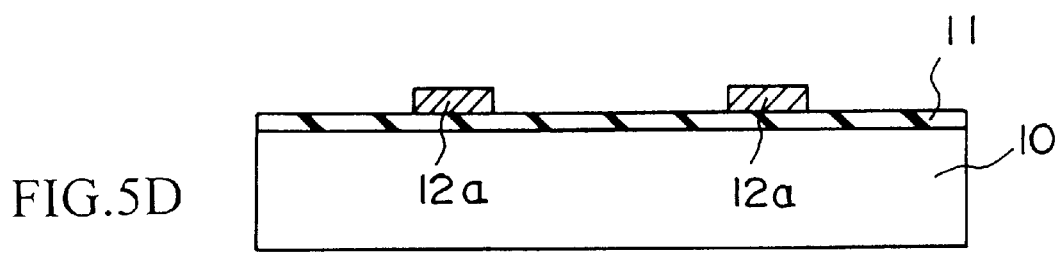
FIG. 5D is a sectional view showing a pertinent portion of the third example of the step of ashing resist in the first embodiment of the present invention.

Like the third example, as shown in FIGS. 5A to 5C, the neutral activated species of the plasmanized water is supplied to the silicon wafer 10 located in the downstream, then the gas mixture of oxygen and water is plasmanized to ash the resist patterns 13 by the neutral activated species in the downstream, and then the water is plasmanized to supply the neutral activated species to the silicon wafer 10 in the downstream. Then, while exhausting the gas from the plasma generating chamber 7d and the reaction chamber 7h, a temperature of the wafer stage 7k is increased up to 200° C. and, as shown in FIG. 5D, the pressure in the reaction chamber 7h is lowered to 1 mTorr. Such condition is kept for 20 to 40 seconds.

Thereafter, the gate valve 8c of the ashing apparatus 7 is opened to take out the silicon wafer 10 from the ashing apparatus 7.

When the corrosion generation on the surface of the wirings 12a is examined by the same way as that in the first example, there has been found no corrosion in an area of about 25 $\mu$m×20 cm and location of the corrosion generation has been zero. Accordingly, if the silicon wafer 10 is left in a low pressure atmosphere for a predetermined time after the ashing step shown in the third example, the corrosion generation can be extremely reduced.

Then, in the above first to fourth examples, in order to examine an amount of chlorine on the silicon wafer 10 after the resist patterns 13 are ashed, the silicon wafer 10 has been analyzed according to the thermal desorption spectroscopy (TDS) method. The results shown in FIG. 6 has been derived.

Meanwhile, the relationship between chlorine atoms and the corrosion being examined by the TDS method has already been set forth in four literatures listed in the following:

(1) Institute of Electronics, Information and Communication Engineers, Technical Report, SDM-94-7(1994-04)

(2) Japan Society of Applied Physics, Preprint 31a-ZF-7, Spring 1994

(3) Proceeding of the Electrochemical Society, 95-01 Abstract No.323

(4) Japan Society of Applied Physics, Preprint 7a-T-4, Autumn 1996

In these literatures, it has been set forth that there exist two kinds of Cl elements, i.e., water soluble Cl element and water insoluble Cl element on the silicon wafer 10 after the resist patterns 13 are ashed, and such water soluble Cl atom causes the corrosion. Furthermore, it has been found that an amount of the water soluble Cl atom is in proportion to a peak height of HCl detected by the TDS method. In other words, based on an amount of HCl detected by the TDS method, an amount of water soluble Cl can be evaluated and it can also be estimated whether the corrosion is generated or not.

Figure 6:
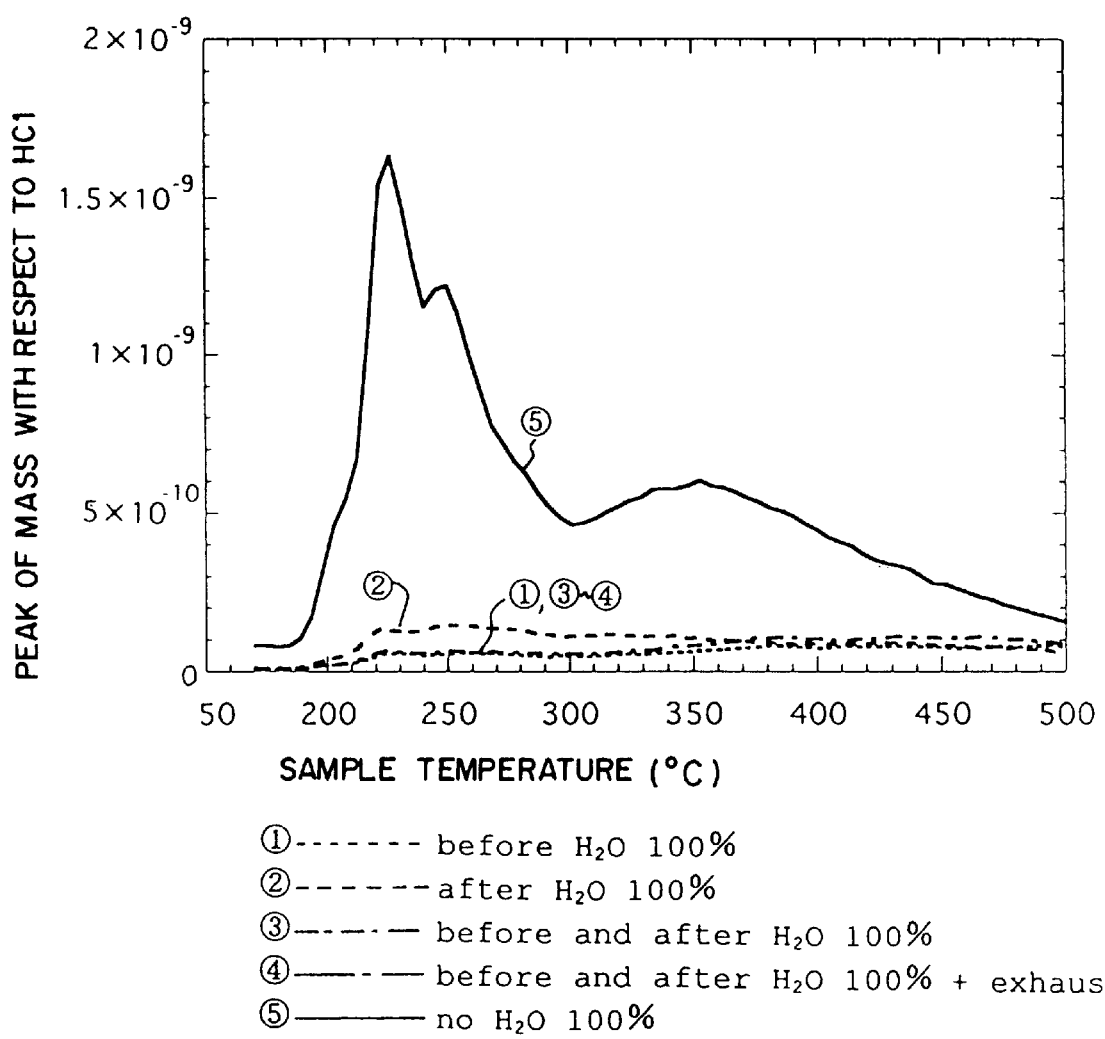
FIG. 6 is a graph showing an amount of contained chlorine according to the resist ashing method in the first to fourth examples of the first embodiment of the present invention and an amount of contained chlorine according to the resist ashing method in the prior art in connection with a wafer heating temperature respectively.

Accordingly, an amount of hydrochloric acid (HCl) corresponds to atomic weight of the water soluble Cl in FIG. 6.

In FIG. 6, lines ① to ④ denote respectively an amount of chlorine on the surface of the silicon wafer after the processes in the above first to fourth examples, and a line ⑤ denotes an amount of chlorine on the surface of the silicon wafer without a exposure of the neutral activated species produced from 100% $H_2O$.

Therefore, it can be seen from FIG. 6 that, if the wirings 12a and the insulating film 11 are exposed to the atmosphere composed only of the neutral activated species of the products obtained by plasmanizing water before or after or before and after the ashing of the resist using the gas mixture of water and oxygen, an amount of the water soluble chlorine contained can be extremely reduced and therefore such step is effective in removing the water soluble Cl. In particular, if the temperature of the silicon wafer 10 is in excess of 200° C., such step becomes effective significantly.

Fifth Example of the first embodiment

In the first to fourth examples, the corrosion generation on the wirings 12a has been able to be suppressed by placing the silicon wafer 10 in the atmosphere of the neutral activated species to thus reduce an amount of water soluble chlorine on the silicon wafer 10. The neutral activated species can be obtained from the plasma which is generated by introducing only $H_2O$ into the plasma generating chamber 7d.

Figure 7:
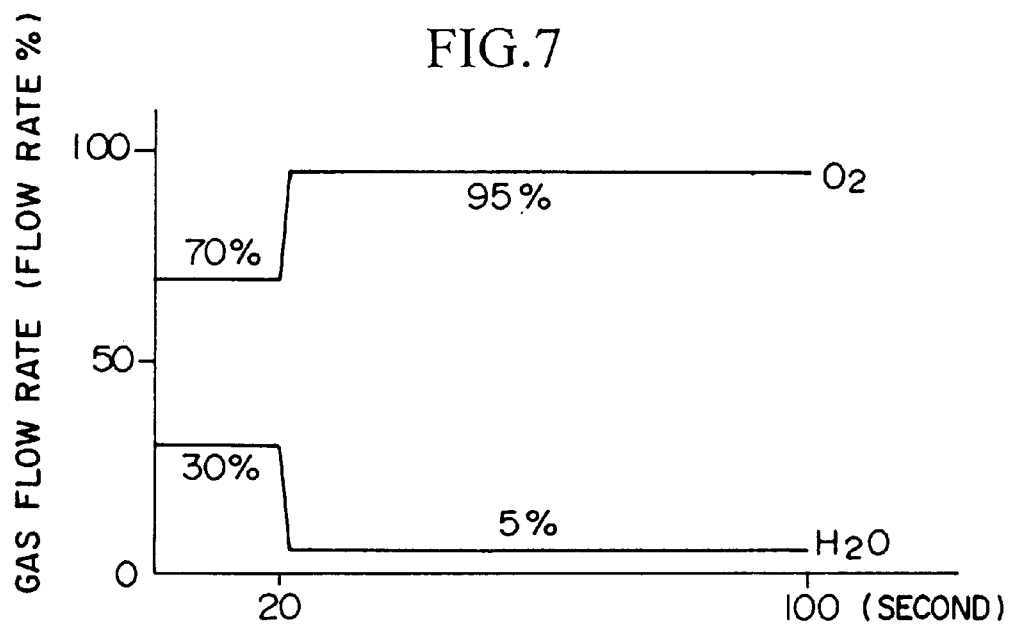
FIG. 7 is a chart showing variation in a flow rate of the gas according to the resist ashing method in a fifth example of the first embodiment of the present invention.

It would be understood that a $H_2O$ containing amount is not always set at 100 flow rate %. If the $H_2O$ is supplied at least 30 flow rate %, a noticeable effect of suppressing the corrosion can be achieved. An example will he explained with respect to FIGS. 3C and 3D and FIG. 7 hereunder.

First, the silicon wafer 10 on which the wirings 12a and the resist pattern 13 are formed is carried into the ashing apparatus 7 and then a temperature of the wafer stage 7k is increased up to 200° C. to bring the silicon wafer 10 into a heated condition.

Then, the gate valve 8c on the ashing apparatus 7 side is closed, then $H_2O$ and $O_2$ are introduced into the plasma generating chamber 7d via the first gas introducing pipe 7e at a flow rate of 300 sccm and via the second gas introducing pipe 7f at a flow rate of 700 sccm respectively, and then the pressure in the plasma generating chamber 7d and the reaction chamber 7h is reduced to 1 Torr. Consequently, $H_2O$ and $O_2$ can be plasmanized by the microwave in the plasma generating chamber 7d.

Only the neutral activated species (first neutral activated species) of plasmanized $H_2O$ and $O_2$ are supplied to the reaction chamber 7h located in the downstream of the gas flow through a large number of small holes in the shower head 7g. As shown in FIG. 3C, the neutral activated species are supplied to the silicon wafer 10 placed on the wafer stage 7k.

Atoms of oxygen (O) and hydrogen (H) or excited molecules such as oxygen ($O_2$), water ($H_2O$), etc. may be utilized as the neutral activated species. In addition, the activated species like OH free radicals may also be utilized as the neutral activated species. Supply of such neutral activated species to the silicon wafer 10 is continued for 20 seconds.

In turn, $O_2$ is introduced into the plasma generating chamber 7d at a flow rate of 1235 sccm via the second gas introducing pipe 7f and at the same time the $H_2O$ gas is introduced into the plasma generating chamber 7d at a flow rate of 65 sccm via the first gas introducing pipe 7e. In this case, the temperature of the wafer stage 7k is held at 200° C.

Accordingly, plasma of the gas including oxygen as a principal component is generated in the plasma generating chamber 7d. Only the neutral activated species (second neutral activated species) of plasmanized $H_2O$ and $O_2$ are supplied to the reaction chamber 7h. As shown in FIG. 3D, the resist patterns 13 on the silicon wafer 10 is ashed by the neutral activated species to be removed.

Such introduction of the gas mixture of water and oxygen into the plasma generating chamber 7d is carried out for 80 seconds.

After this, it has been deduced that, when the corrosion generation on the surface of the wirings 12a on the silicon wafer 10 has been checked under the condition shown in the first example of the first embodiment, eight corrosions have been generated.

From the above, it has become evident that, if the process according to the down-flow of the gas including $H_2O$ of more than 30 flow rate % of the introduced gas is carried out before the resist is removed by ashing, the corrosion generation can be suppressed rather than the prior art.

Figure 8:
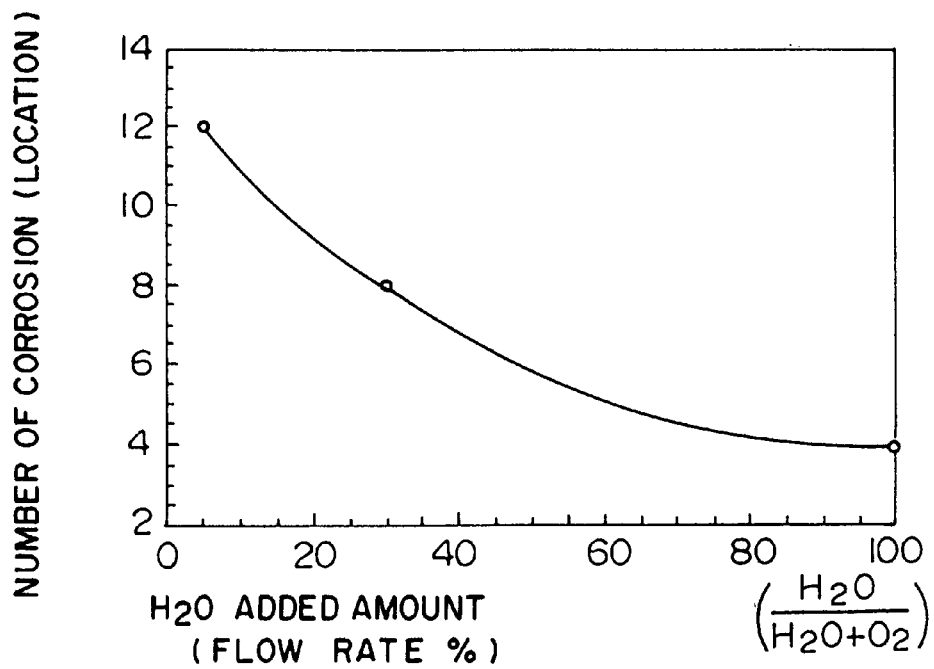
FIG. 8 is a graph showing a relationship between a flow rate ratio of $H_2O$ of gases and the number of corrosion generation according to the resist ashing method in the fifth example of the first embodiment of the pre(sent invention.

Next, when the number of corrosion generation has been checked while changing an amount of $H_2O$ contained in the gas mixture of $O_2$ and $H_2O$, the characteristic shown in FIG. 8 has been derived. From FIG. 8, it has been understood that the more an amount of $H_2O$ is increased the more remarkable the effect of suppressing the corrosion generation becomes. In particular, if an amount of $H_2O$ is in excess of 30 flow rate %, the number of the corrosion generation has been able to be reduced ⅔ times or less than the case where an amount of $H_2O$ is reduced less than 5 flow rate %.

In the first embodiment, ashing of the resist is carried out by one step according to the down-flow of the gas mixture of $O_2$ and $H_2O$. However, if the wafer process according to the down-flow of $H_2O$ at more than 30 flow rate % and the wafer process according to the down-flow of the gas including oxygen as a principal component are repeated plural times alternatively, the effect of preventing the corrosion generation can be further enhanced.

By the way, when chlorine atoms on the silicon wafer 10 are removed by exposing the silicon wafer 10 to the atmosphere of the product obtained by plasmanizing $H_2O$, the oxygen atoms also exist in the product. Therefore, the resist is slightly ashed although its ashing rate is small. However, in the above explanation, because a capability of removing chlorine atoms has been particularly observed, such an expression that "the resist is ashed by the product" has not been employed, but another expression that "the resist patterns 13 are exposed to the atmosphere of the product" has been employed.

(Second Embodiment)

As explained in the first embodiment, the deteriorated resist layer including Al atoms has been formed on the surface of the resist pattern 13 on the wafer after the wiring 12a has been formed by etching the metal film 12 by use of anisotropic etching. In addition, the organic film including Al atoms and Cl atoms has been formed on the surface of the wiring 12a. The deteriorated resist layer and the organic film are difficult to be ashed compared to the resist itself. Therefore, there are cases where, after anisotropic etching has been carried out, the deteriorated resist layer and the organic film cannot be completely removed by ashing. Further, in some cases the deteriorated resist layer and the organic film cannot be removed by the wet process using chemicals or water after etching and ashing processes using chemicals or after etching and ashing processes are carried out. Moreover, the deteriorated resist layer and the organic film often act as residue or dust to thus lower the yield or to thus disturb removal of Cl from the wiring 12a so that corrosion is readily generated. Therefore, the deteriorated resist layer and the organic film must be removed as much as possible by ashing, otherwise they must be removed completely by ashing process and wet treating process is needed which does not leave the deteriorated resist layer and the organic film as the ashing residue.

The inventors of the present invention have been found that, when effectiveness of the down-flow of $H_2O$ plasma explained in the first embodiment against reduction of residual chlorine is examined, the gas being generated by the $H_2O$ plasma is effective in reducing the ashing residue. Then, an advantage of reduction in the ashing residue will be explained hereunder.

First, like the case shown in FIGS. 3A and 3B, a plurality of samples wherein the wirings 12a are formed on the silicon wafer 10 by use of the resist patterns 13 are prepared and then the ashing step in the prior art and the ashing step according to the second embodiment are carried out with respect to the samples respectively. Following results have been obtained.

In this case, i-line resist (product name: PFI-47 manufactured by Sumitomo Chemical Co., Ltd.) which is different from that employed in the first embodiment has been employed as the resist material constituting the resist patterns 13. A width of each resist pattern 13 is selected as 0.5 μm. A multilayered metal film made of 1000 Å thick TiN/6000 Å thick AlCuTi/1000 Å thick TiN being formed sequentially is used as the metal film constituting the wirings 12a.

Prior Art

At first, the sample is placed on the wafer stage 7k in the chamber 7a shown in FIG. 2, then oxygen is introduced into the plasma generating chamber 7d at a flow rate of 1235 sccm (95 flow rate %) via the second gas introducing pipe 7f according to the prior art. At the same time, gaseous $H_2O$ is introduced into the plasma generating chamber 7d at a flow rate of 65 sccm (5 flow rate %) via the first gas introducing pipe 7e. In this case, the temperature of the wafer stage 7k is held at 200° C.

Figure 9:
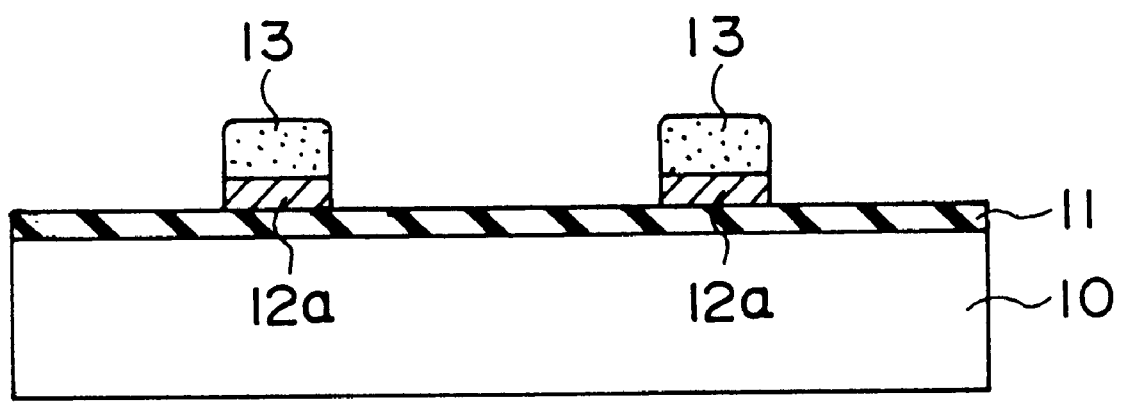
FIG. 9 is a sectional view showing residuals on wirings after the ashing step according to the prior art.

Thereafter, when the neutral activated species generated from the plasma are supplied to the resist patterns 13 of the sample for 100 seconds, the resist patterns 13 are scarcely ashed and thus remain on the wirings 12a, as shown in FIG. 9. This is because the deteriorated layer formed on the surface of the resist patterns 13 does interrupt the ashing of the resist patterns 13.

Figure 10:
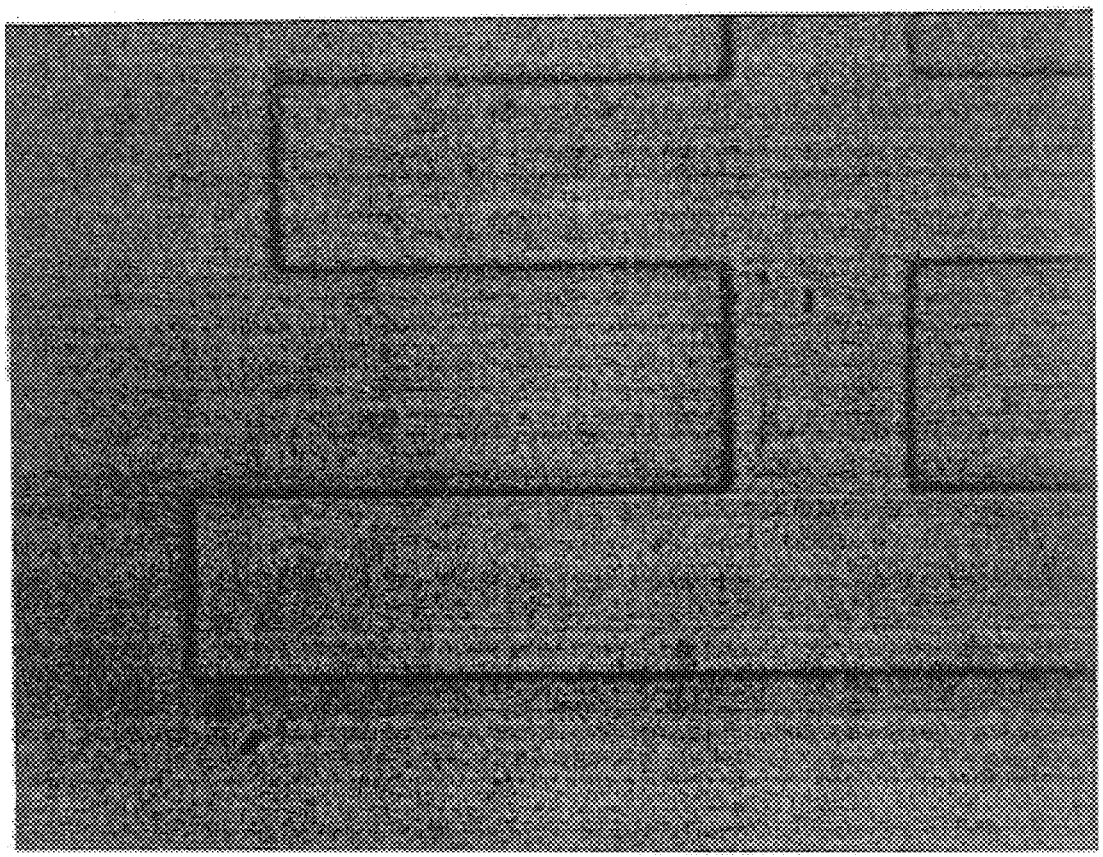
FIG. 10 is a microphotograph showing a wiring after the ashing step according to the prior art.
Figure 11:
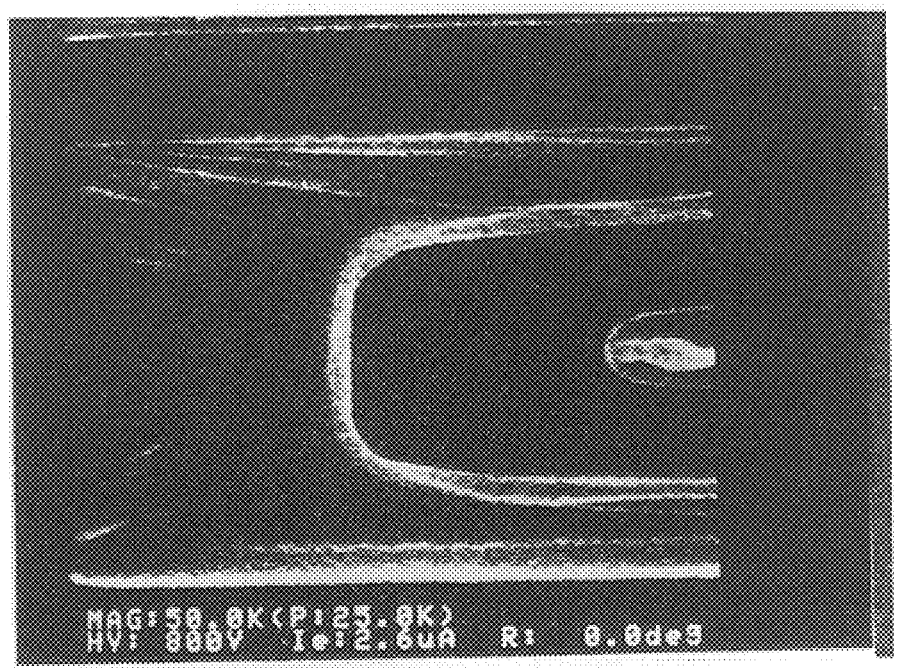
FIG. 11 is a SEM photograph showing wirings after the ashing step according to the prior art.

The wirings 12a remaining on a part of the resist patterns 13, if shown by the microphotograph, are given in FIG. 10. Furthermore, FIG. 11 is a SEM photograph showing another part of the wirings 12a which is taken by the SEM (Scanning Electron Microscope). Incomplete removal of the resist patterns 13 can be seen clearly in FIG. 11.

Figure 12:
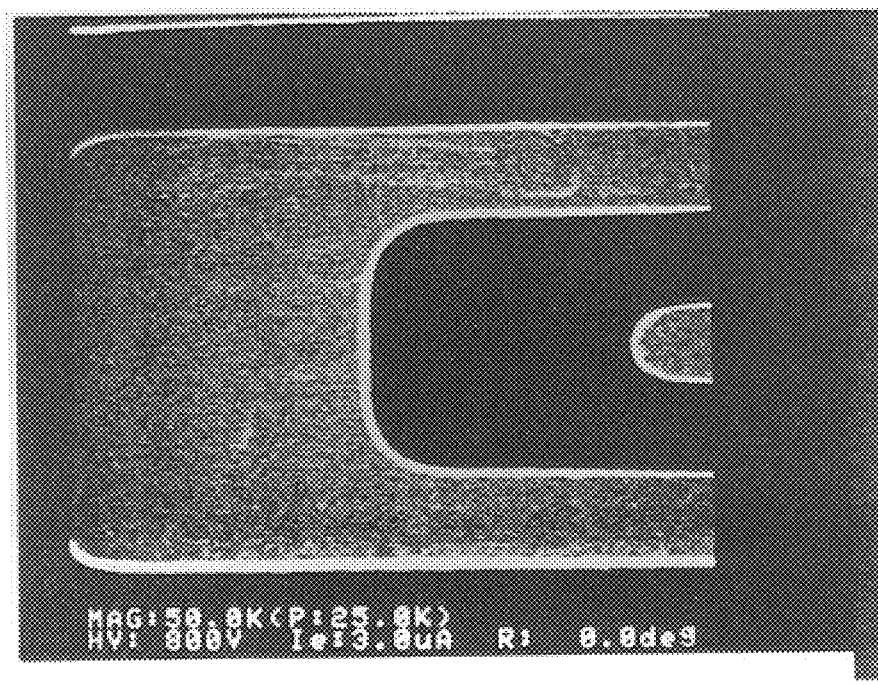
FIG. 12 is another SEM photograph showing wirings after the wet process is conducted by use of a resist releasing liquid after the ashing step according to the prior art.

In order to remove such residue of the resist patterns 13, a resist releasing liquid (product name: ACT935 manufactured by ACT Corporation) is supplied to the wafer 10 and then the surface of the wirings 12a is rinsed with isopropyl alcohol and pure water. When a part of the wirings 12a is observed by the SEM after such wet process, an image shown in FIG. 12 can be obtained. It can be seen from the SEM photograph of FIG. 12 that the resist patterns 13 shown in FIG. 11 are hardly removed by the wet process.

First Example of the second embodiment

The sample is placed on the wafer stage 7k in the chamber 7a shown in FIG. 2, then the temperature of the wafer stage 7k is increased up to 200° C. by the heater 7m to bring the silicon wafer 10 into a heated condition. Subsequently, after the gate valve 8c of the ashing apparatus 7 is closed, gaseous water ($H_2O$) is introduced into the plasma generating chamber 7d at a flow rate of 300 sccm (95 flow rate %) via the first gas introducing pipe 7e of the ashing apparatus 7 and other gases are not introduced into the plasma generating chamber 7d. That is to say, the gaseous $H_2O$ of 100 flow rate % is introduced into the plasma generating chamber 7d. The pressure in the plasma generating chamber 7d and the reaction chamber 7h is regulated to 1 Torr and $H_2O$ is then plasmanized by the microwave.

Figure 13A:
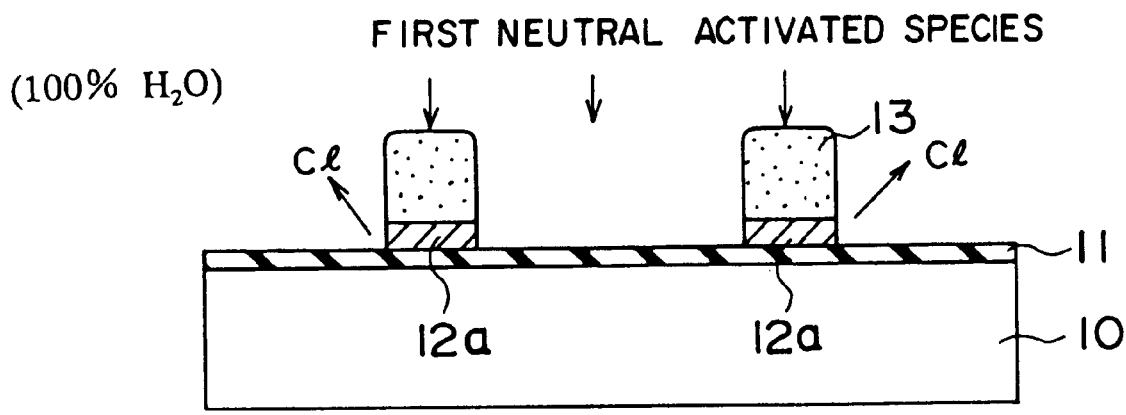
FIGS. 13A and 13B are sectional views showing a first example of the resist ashing step to remove resist residue in a second embodiment of the present invention.

Thus, as shown in FIG. 13A, the neutral activated species (first neutral activated species) of the plasmanized $H_2O$ are supplied to the silicon wafer 10 and the resist patterns 13 on the wafer stage 7k.

After the first neutral activated species is supplied to the silicon wafer 10 for 20 seconds, oxygen is introduced into the plasma generating chamber 7d at a flow rate of 1235 sccm via the second gas introducing pipe 7f. At the same time, $H_2O$ is introduced into the plasma generating chamber 7d at a flow rate of 65 sccm via the first gas introducing pipe 7e. In this case, the temperature of the wafer stage 7k is held at 200° C.

Figure 13B:
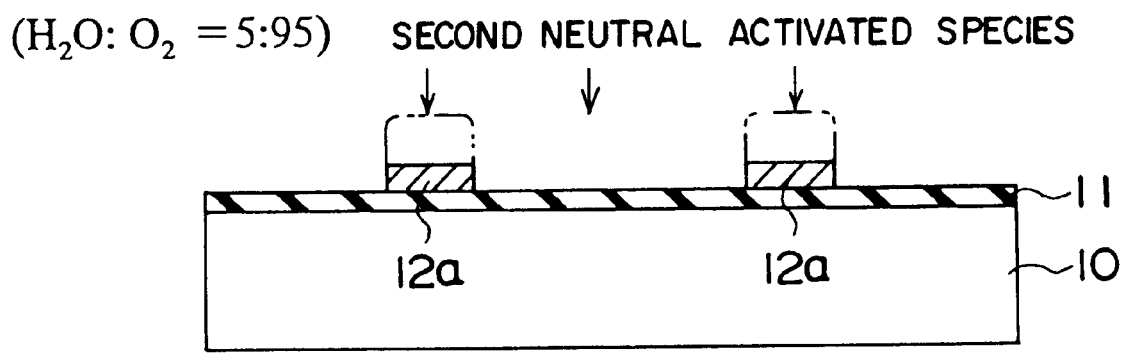

Thus, the plasma including oxygen as a principal component is generated in the plasma generating chamber 7d. As shown in FIG. 13B, the neutral activated species (second neutral activated species) of plasmanized oxygen and water are supplied to the silicon wafer 10 on the wafer stage 7k. After the introduction of the gas including oxygen as a principal component into the plasma generating chamber 7d is continued for 80 seconds, such introduction of the gas mixture is terminated.

Figure 14:
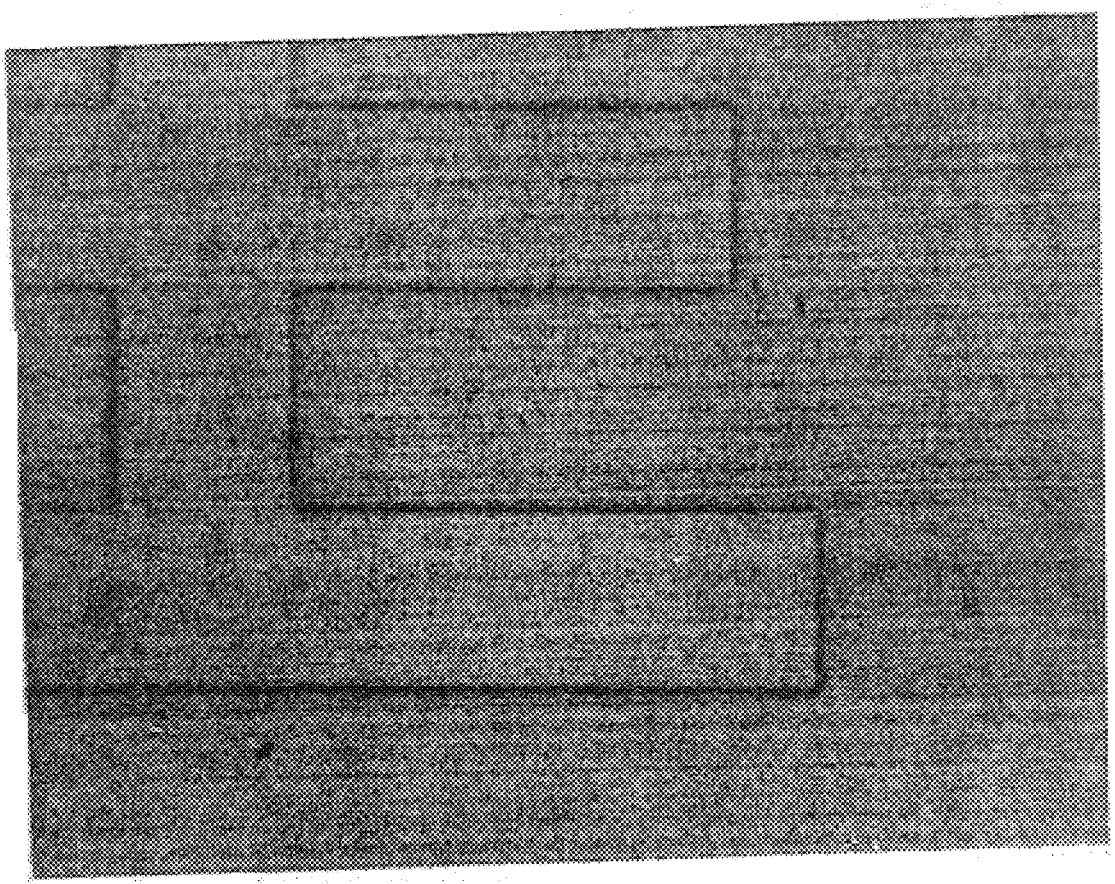
FIG. 14 is a microphotograph showing a wiring after the ashing step shown in FIGS. 13A and 13B.
Figure 15:
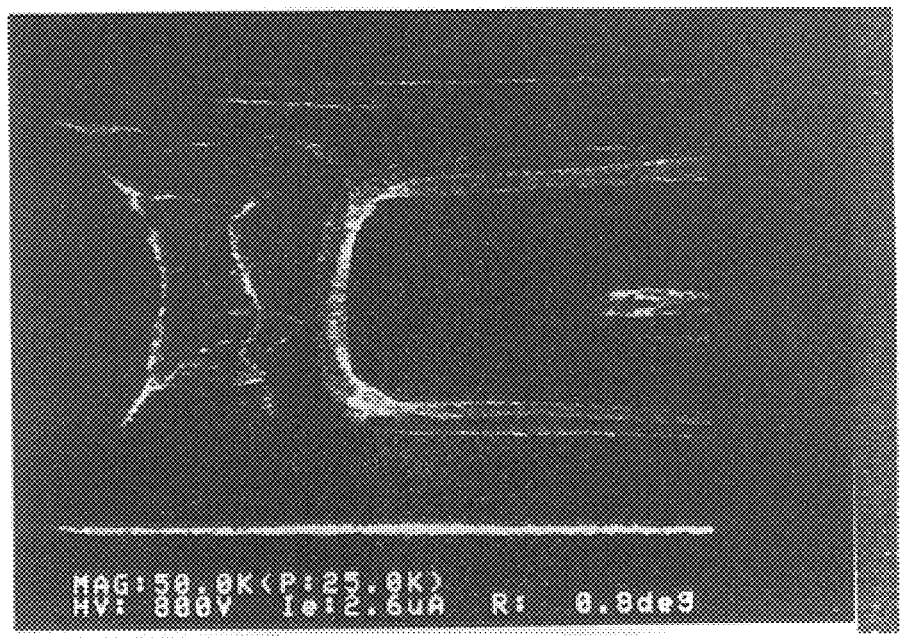
FIG. 15 is a SEM photograph showing wirings after the ashing step shown in FIGS. 13A and 13B.

When the surface of the wirings 12a is taken as the microphotograph after the ashing of the resist patterns 13 under such conditions is terminated, an image shown in FIG. 14 can be detected wherein the resist patterns 13 scarcely remain on the wirings 12a. In addition, another image shown in FIG. 15 can be detected by another SEM photograph of other part of the wirings 12a. The resist residue, though slightly, has been found from FIG. 15. In FIG. 15, a star-shaped mark is a part of the resist residue.

Figure 16:
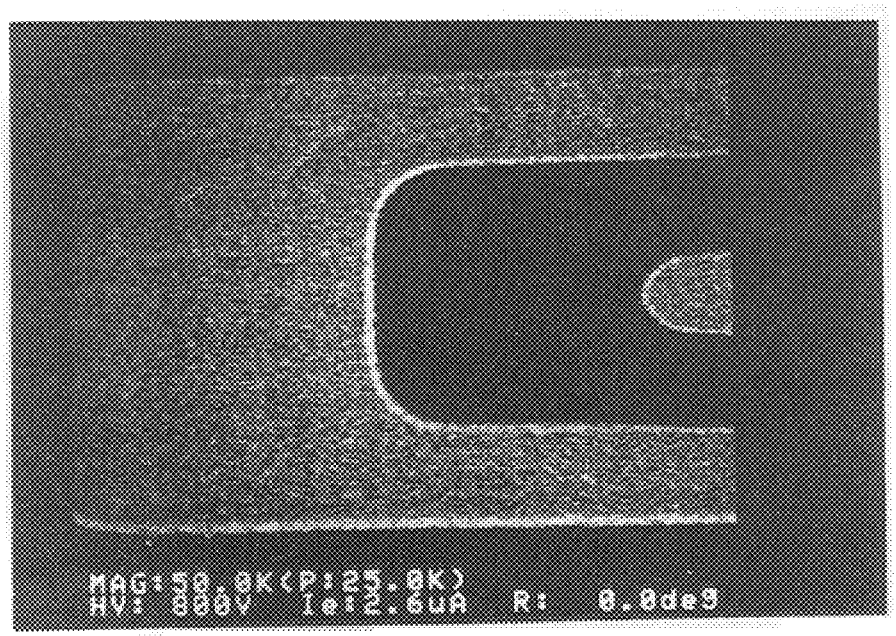
FIG. 16 is another SEM photograph showing wirings in FIG. 15 after they are further processed by use of the resist releasing liquid.

In addition, when the wet process is carried out by using sequentially the resist releasing liquid (product name: ACT935 manufactured by ACT Corporation), the isopropyl alcohol, and the pure water in order to remove the resist residue, a SEM image shown in FIG. 16 can be obtained wherein the resist residue appeared in FIG. 15 can be eliminated. In other words, the product derived by the plasmanized $H_2O$ makes it possible to reduce the resist residue and enhance the releasing effect of the resist releasing liquid.

Consequently, it has been found that supply of the activated species of the plasmanized $H_2O$ to the resist patterns 13 is able to achieve an effect of removing not only chlorine but also the organic deteriorated layer formed on the surface of the resist patterns 13.

Second Example of the second embodiment

The sample is placed on the wafer stage 7k in the chamber 7a shown in FIG. 2, then the temperature of the wafer stage 7k is set to 200° C. by the heater 7m to bring the silicon wafer 10 into a heated condition. Subsequently, after the gate valve 8c of the ashing apparatus 7 is closed, oxygen ($O_2$) is introduced into the plasma generating chamber 7d at a flow rate of 700 sccm via the second gas introducing pipe 7f of the ashing apparatus 7. At the same time, gaseous $H_2O$ is introduced into the plasma generating chamber 7d at a flow rate of 300 sccm via the first gas introducing pipe 7e. The pressure in the plasma generating chamber 7d and the react-on chamber 7h is regulated to 1 Torr and $H_2O$ and $O_2$ are then plasmanized by the microwave.

Figure 17A:
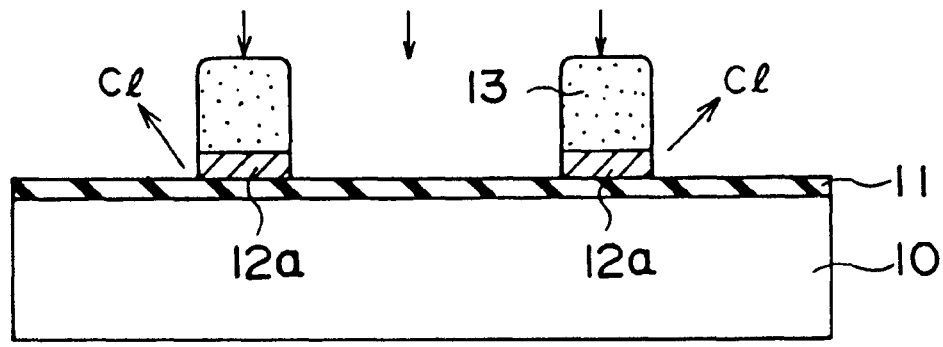
FIGS. 17A and 17B are sectional views showing a second example of the resist ashing step to remove the resist residue in the second embodiment of the present invention.

Thus, as shown in FIG. 17A, only the neutral activated species (first neutral activated species) of the plasmanized $H_2O$ and $O_2$ are supplied to the silicon wafer 10 and the resist patterns 13 on the wafer stage 7k.

After supply of the first neutral activated species to the silicon wafer 10 is continued for 20 seconds, oxygen is introduced into the plasma generating chamber 7d at a flow rate of 1235 sccm via the second gas introducing pipe 7f. Simultaneously, the gas composed of at least $H_2O$ is introduced into the plasma generating chamber 7d at a flow rate of 65 sccm via the first gas introducing pipe 7e. In this case, the temperature of the wafer stage 7k is held at 200° C. Also, in this case, other gases are not introduced into the plasma generating chamber 7d.

Figure 17B:
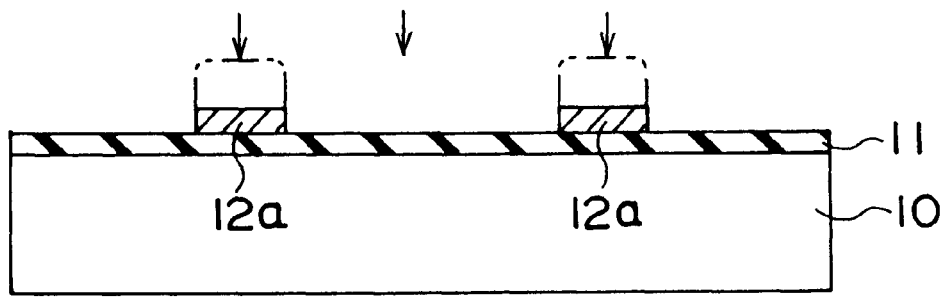

Accordingly, the plasma including oxygen as a principal component is generated in the plasma generating chamber 7d. As shown in FIG. 17B, the neutral activated species (second neutral activated species) of plasmanized oxygen and water are supplied to the silicon wafer 10 on the wafer stage 7k. After the introduction of the gas including oxygen as a principal component into the plasma generating chamber 7d is continued for 80 seconds, such introduction of the gas is terminated.

Figure 18:
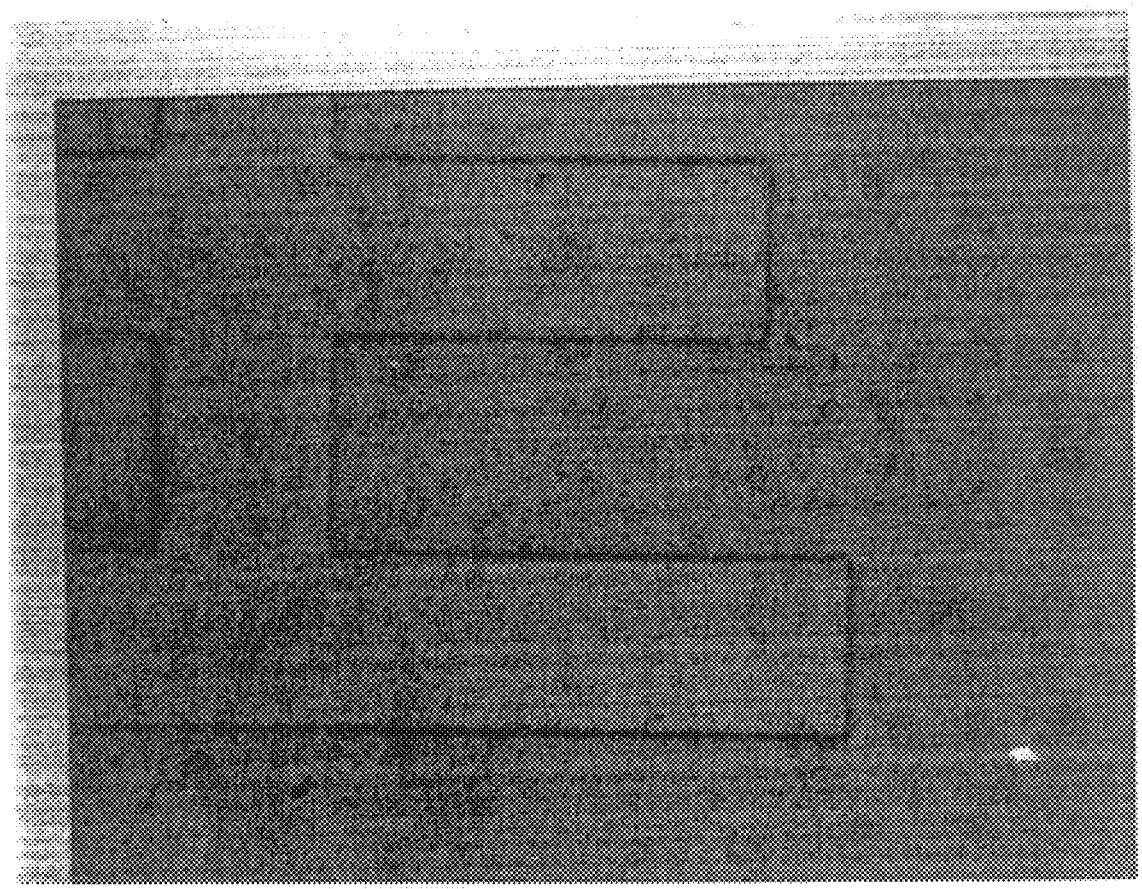
FIG. 18 is a microphotograph showing a wiring after the ashing step shown in FIGS. 17A and 17B.
Figure 19:
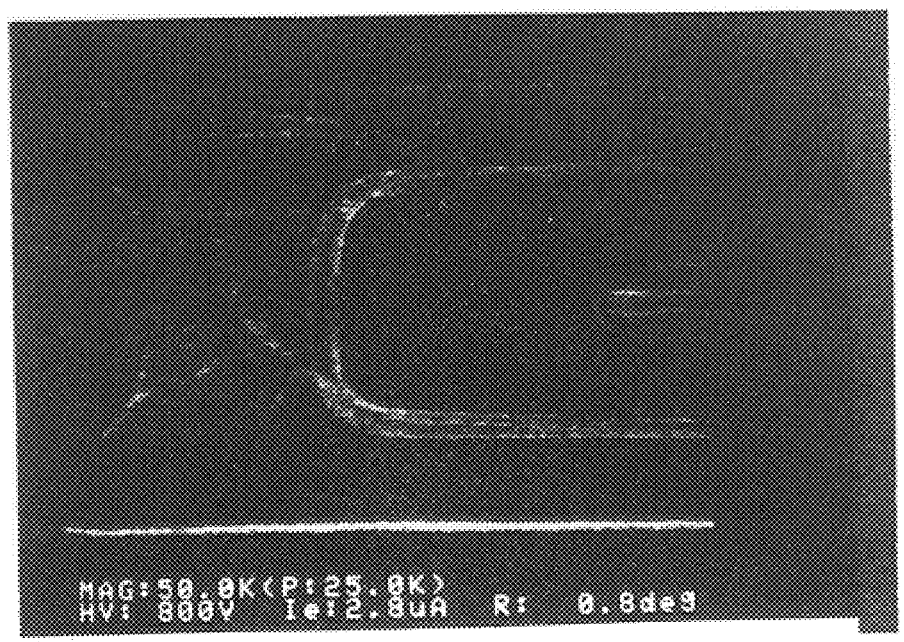
FIG. 19 is a SEM photograph showing wirings after the ashing step shown in FIGS. 17A and 17B.

When the surface of the wirings 12a is taken as the microphotograph after the ashing of the resist patterns 13 under such conditions is terminated, an image shown in FIG. 18 can be detected. The resist patterns 13 scarcely remain on the wirings 12a. Further, when other portion of the wirings 12a is taken by the SEM as the microphotograph, another image shown in FIG. 19 can be detected. The resist residue has resided, though slightly. In FIG. 19, a star-shaped mark is the resist residue. The resist residue has been detected much more in the second example than the first example.

Figure 20:
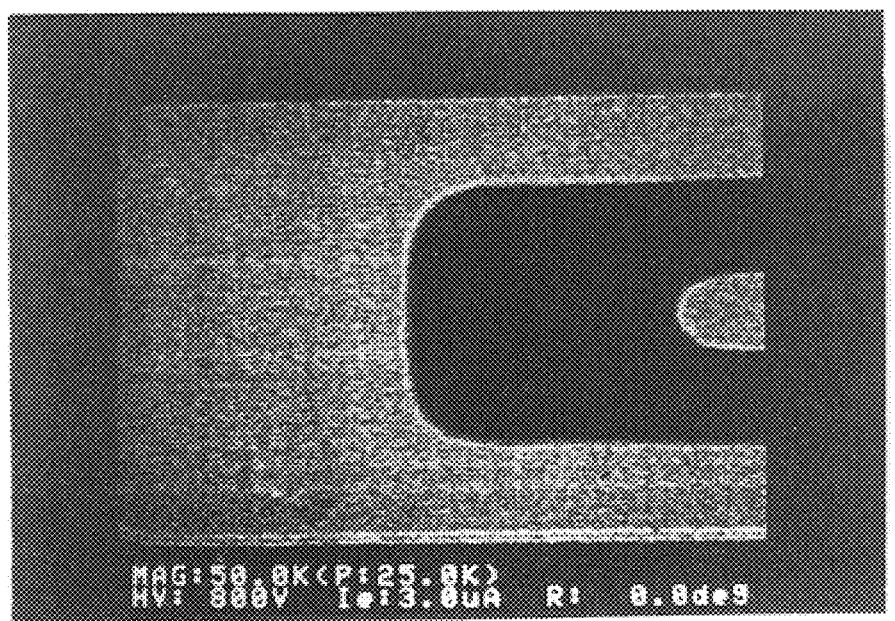
FIG. 20 is another SEM photograph showing wirings in FIG. 19 after they are further processed by use of the resist releasing liquid.

When the wet process is carried out by using sequentially the resist releasing liquid (product name: ACT935 manufactured by ACT Corporation), the isopropyl alcohol, and the pure water in order to remove the resist residue, a SEM image shown in FIG. 20 can be obtained. The organic residue of the resist observed in FIG. 19 can be eliminated completely.

As a result, it has been found that supply of the activated species, which can be derived by plasmanizing $H_2O$ in excess of 30 flow rate %, to the resist patterns 13 as a pre-treatment step of the ashing process can achieve an effect of removing not only chlorine but also the organic deteriorated layer formed on the surface of the resist patterns 13. Though still not clearly understood, the mechanism which removes the organic deteriorated layer may be supposed that the OH radical has a larger capability of removing the organic deteriorated layer.

If $H_2O$ is made less than 30 flow rate % as the pre-treatment step of the ashing process, the effect of removing the resist residue is lessened drastically.

(Third Embodiment)

In the ashing apparatus, in order to increase an ashing speed, the wafer is heated by setting the wafer stage 7k to about 200° C. upon ashing.

However, if the resist on the silicon wafer is ashed while heating the silicon wafer at the temperature of about 200° C., the deteriorated layer is ready to be formed on the surface of the resist. This is because, when the metal film beneath the resist is etched, metal element and chlorine are stuck to the surface of the resist so that the resist is deteriorated. The deteriorated layer easily becomes the residue on the silicon wafer after the ashing process. In addition, such residue prevents chlorine from being released from the wirings 12a and remains as a trash in the semiconductor device manufacturing steps.

Therefore, upon ashing of the resist, such a technique becomes important that can render the ashing speed relatively high and can produce no residue of the deteriorated layer. Ashing conditions for achieving such object will be explained hereunder.

In the third embodiment, the metal film constituting the wirings 12a is different in structure from that in the first embodiment. That is to say, a multi-layered structure made of 20 nm thick Ti/150 nm thick TiN/350 nm thick AlCuTi, which are sequentially formed, is employed as the metal film in the third embodiment. A silicon of 16 nm thickness is formed on AlCuTi by sputtering to suppress reflection of a light (i-ling) from the metal film upon exposure of the resist. The silicon is represented as "S—Si" hereinafter. Incidentally S—Si is removed after ashing of the resist.

In the third embodiment, since the resist forming condition and the etching condition are set similarly to those in the first embodiment, the explanation of the steps carried out before the ashing process will be omitted.

First Example of the third embodiment

Figure 21A:
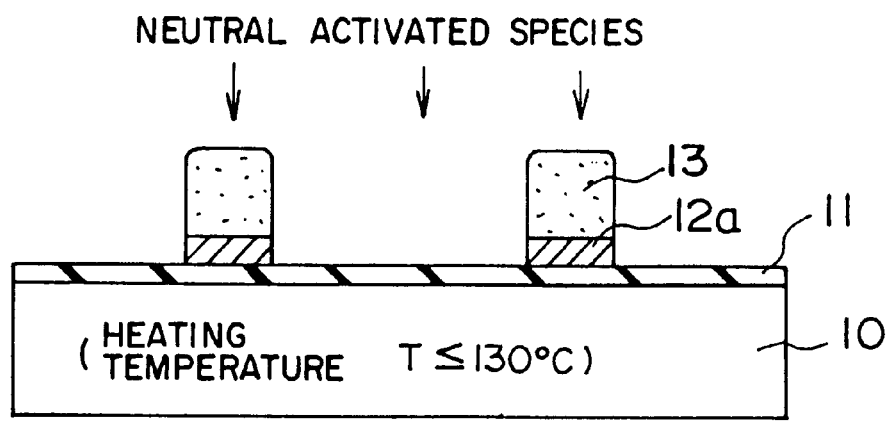
FIG. 21A to 21C are sectional views showing an ashing step according to a first example of the third embodiment of the present invention.

The silicon wafer shown in FIG. 21A shows a state wherein the wirings 12a are formed on the insulating film 11 according to the first embodiment. However, the metal film constituting the wirings 12a has a multi-layered structure made of Ti/TiN/AlCuTi.

After the wirings 12a are formed, the silicon wafer 10 is loaded on the wafer stage 7k of the ashing apparatus 7 and the temperature of the wafer stage 7k is raised to less than 130° C. by the built-in heater 7m. The ashing apparatus 7 has the structure shown in FIG. 2.

Figure 21B:
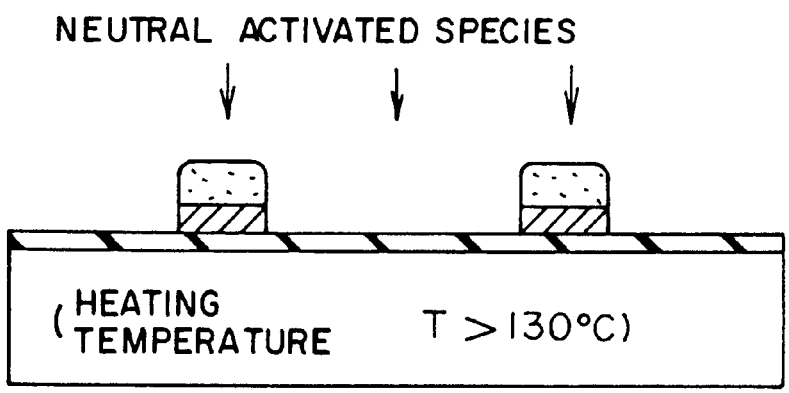

Next, $H_2O$ is introduced into the plasma generating chamber 7d at a flow rate of 65 sccm via the first gas introducing pipe 7e, and $O_2$ is also introduced into the plasma generating chamber 7d at a flow rate of 1235 sccm via the second gas introducing pipe 7f. The pressure in the reaction chamber 7h is then reduced up to 1 Torr. As shown in FIG. 21, an upper layer of the resist patterns 13 on the silicon wafer 10 is ashed for 20 seconds by the neutral activated species, which are supplied from the plasma generating chamber 7d to the reaction chamber 7h located in the downstream of the plasma generating chamber 7d, and then removed.

Figure 21C:
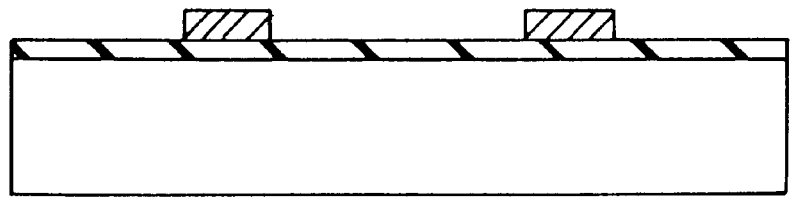

Thereafter, the temperature of the wafer stage 7k is increased up to 200° C. and then the resist is ashed by the neutral activated species for 80 seconds, as shown in FIG. 21C. In turn, introduction of $H_2O$ and $O_2$ via the first and second gas introducing pipes 7e, 7f are stopped.

Figure 22:
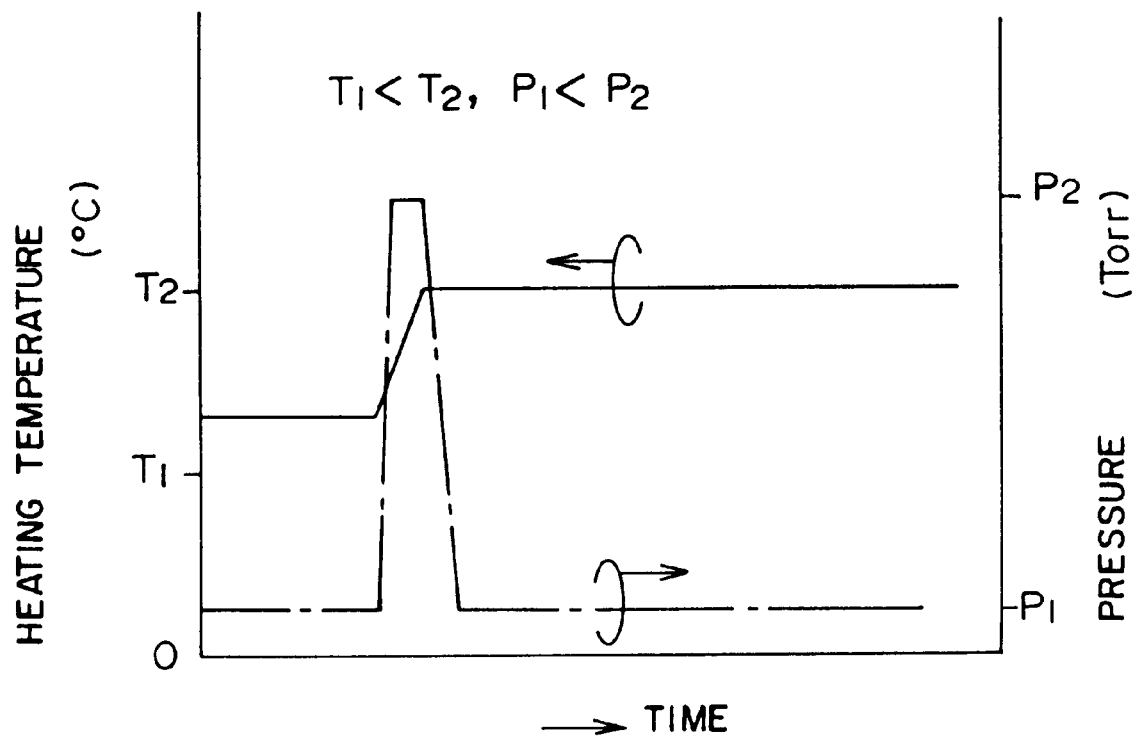
FIG. 22 is a chart showing variation in a wafer heating temperature and variation in the pressure of the ashing atmosphere with respect to time upon ashing in the third embodiment of the present invention.

If a variation in the heating temperature is shown, it is given by a solid line in FIG. 22. The temperature is increased from the temperature T1 (less than 130° C.) to the temperature T2 (more than 130° C.).

Figure 23:
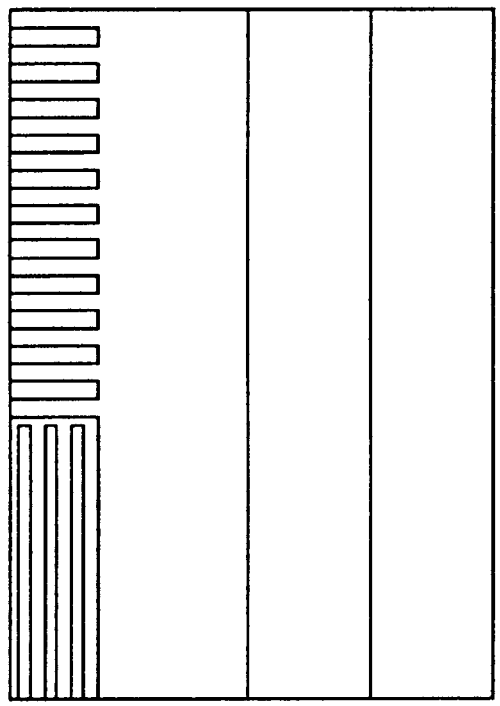
FIGS. 23 and 24 are microphotographs respectively showing a wiring and its peripheral regions after the ashing step according to the first example of the third embodiment of the present invention.
Figure 24:
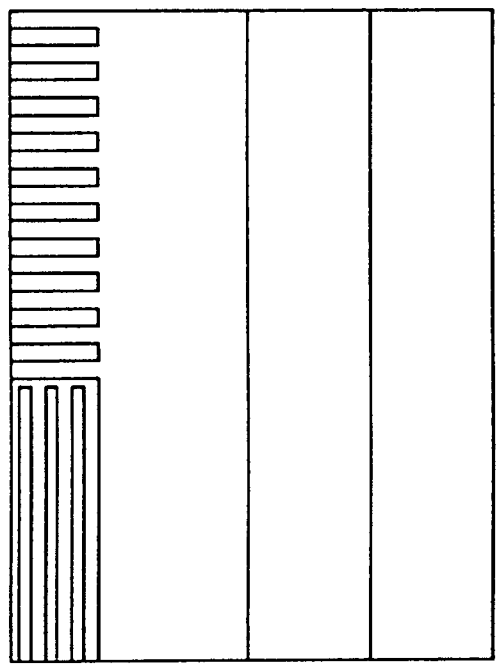

As stated above, in the initial stage of ashing, when ashing is conducted by setting the heating temperature of the resist patterns 13 to less than 130° C. and then the heating temperature of the resist patterns 13 to less than 200° C., planar shapes shown in microphotographs of FIGS. 23 and 24 have been formed on the wirings 12a and their peripheral regions.

FIG. 23 is a microphotograph showing planar shapes of the wirings and their peripheral regions after the ashing is carried out for 20 seconds at the heating temperature of 100° C. and then the ashing is carried out for 80 seconds at the heating temperature of 200° C. FIG. 24 is a microphotograph showing upper surfaces of the wirings and their underlying layer after the ashing is carried out for 20 seconds at the heating temperature of 130° C. and then the ashing is carried out for 80 seconds at the heating temperature of 200° C. Light color portions in FIGS. 23 and 24 correspond to the wirings respectively.

According to FIGS. 23 and 24, no resist residue remains on the surface of the wiring at all. Accordingly, a barrier can be removed upon releasing chlorine from the surface of the wiring and the residue causing the trash can be removed.

Figure 25:
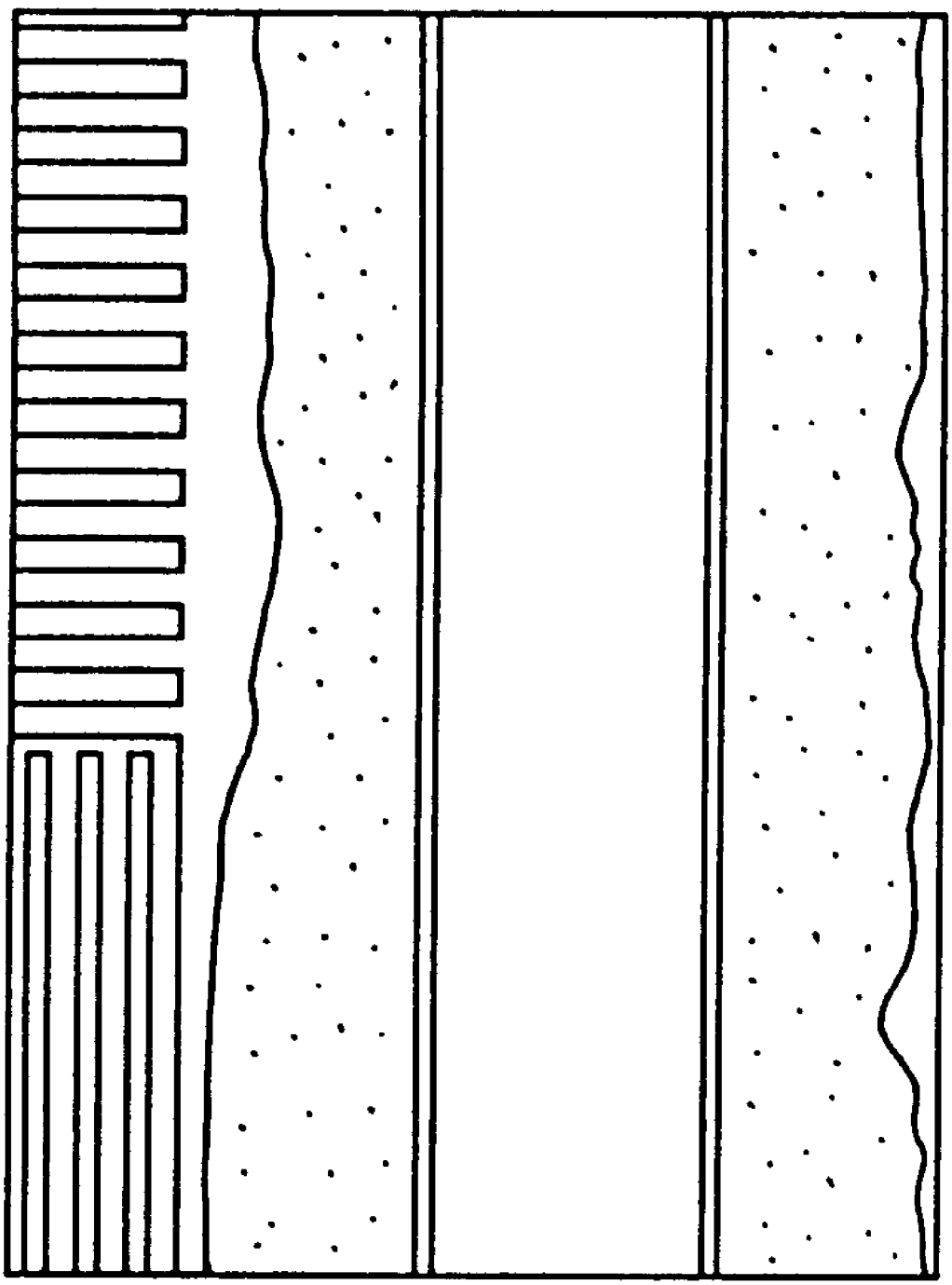
FIG. 25 is a microphotograph showing a wiring and its peripheral regions after the ashing step in the prior art.

On the contrary, a microphotograph depicting the results of the ashing process during when the heating temperature of the resist is kept at 200° C. from the beginning to the end of ashing is shown in FIG. 25. According to this microphotograph, since the deteriorated layer of the resist remains on the surface, it causes the trash and serves as an obstacle to remove chlorine from the surface of the wiring. The similar conditions except for the ashing temperature are employed.

In the microphotographs shown in FIGS. 23 to 25, a width of the line and space in the narrow wiring area is selected to 0.5 μm.

While, in the first example, the temperature of the wafer stage 7k is controlled as the method of changing the heating temperature of the silicon wafer 10. However, a following way may be adopted to change the temperature of the silicon wafer, i.e., the temperature of the resist.

Figure 26A:
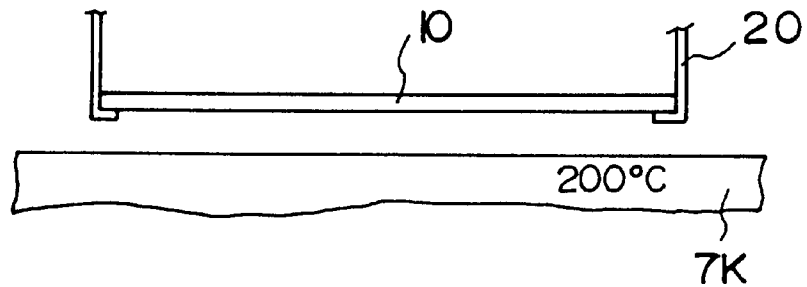
FIGS. 26A and 26B are views respectively showing an example of a wafer temperature controlling method according to the third embodiment of the present invention.
Figure 26B:
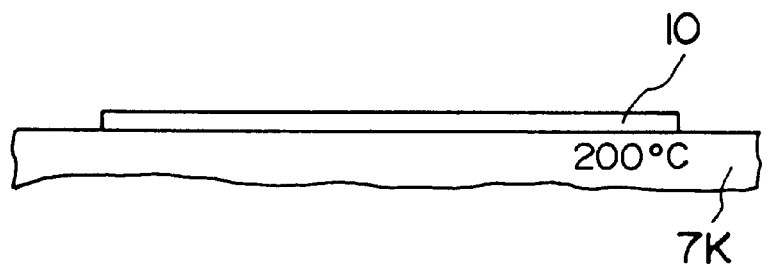

For instance, as shown in FIG. 26A, the silicon wafer 10 is held by lift pins 20 over the wafer stage 7k at a distance. In this state, the ashing of the resist patterns 13 by the neutral activated species is commenced. After this, as shown in FIG. 26B, even if the silicon wafer 10 is heated at 200° C. on the wafer stage 7k after 20 seconds are passed, for example, the effect of eliminating the resist residue is also generated.

Figure 27:
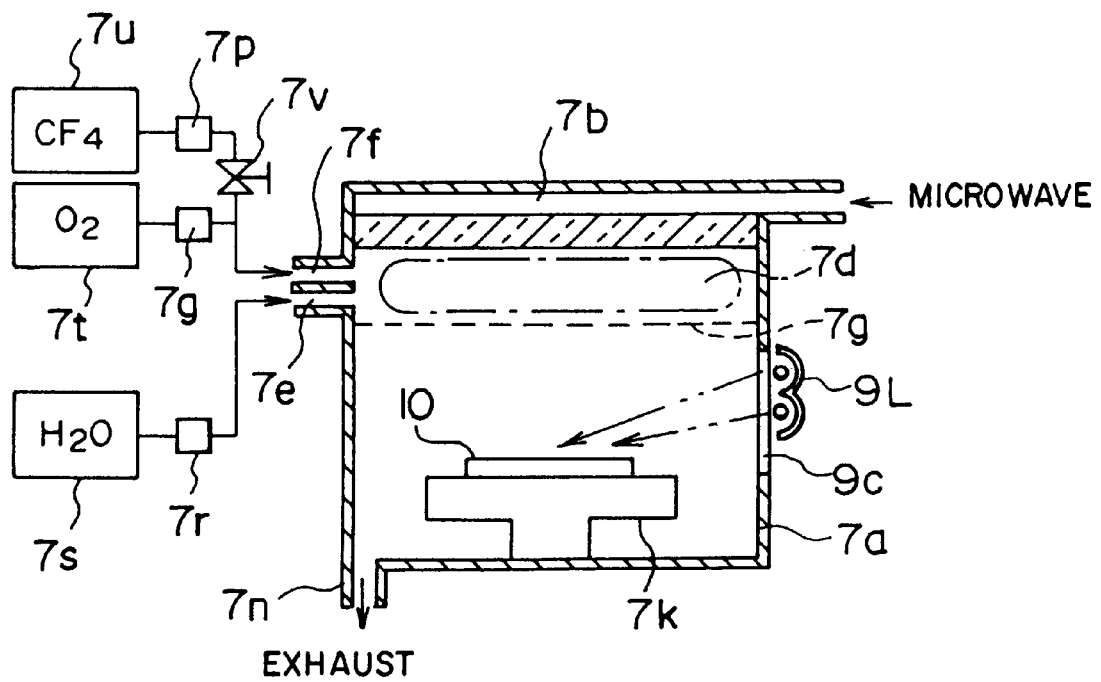
FIG. 27 is a schematic sectional view showing a configuration of a second example of an ashing apparatus for use in embodiments of the present invention.

In addition, the wafer heating structure is not limited to the built-in heater 7m of the wafer stage 7k, but the wafer temperature (resist temperature) can be changed by providing a lamp 9L to irradiate the light to the silicon wafer 10, as shown in FIG. 27. The lamp 9L is arranged at a location which is able to irradiate the light to the silicon wafer 10 through a quartz plate 9c in the outside of the reaction chamber 7h.

In order to change the temperature, a way by which the lamp 9L is turned off in the initial stage of the aching and then the lamp 9L is turned on, or another way by which a quantity of emitted light of the lamp 9L is made small in the initial stage and then is enhanced may be employed selectively.

Second Example of the third embodiment

In the first example, as shown in FIG. 22, the heating temperature in the ashing process has been raised from the first temperature T1 to the second temperature T2 and also the first temperature T1 has been set less than 130° C. and the second temperature T2 has been set to 200° C. However, the second temperature T2 is not particularly limited to 200° C and therefore an example of the second temperature T2 will be explained herein below.

$H_2O$ is introduced into the plasma generating chamber 7d at a flow rate of 65 sccm via the first gas introducing pipe 7e shown in FIG. 2, and $O_2$ is also introduced into the plasma generating chamber 7d at a flow rate of 1235 sccm via the second gas introducing pipe 7f. The pressure in the reaction chamber 7h is also reduced up to 1 Torr. Like FIG. 21A, a surface layer of the resist patterns 13 on the silicon wafer 10 is ashed for 20 seconds by the neutral activated species, which are supplied from the plasma generating chamber 7d to the reaction chamber 7h located in the downstream of the plasma generating chamber 7d, and then removed.

Thereafter, by stopping the supply of $H_2O$ and $O_2$, the ashing is temporarily stopped and the pressure is increased. When the pressure is stabilized, the temperature of the wafer stage 7k is increased up to 180° C. Then, introduction of the gas mixture of $H_2O$ and $O_2$ is started once again and the ashing of the resist patterns by using the neutral activated species is also re-started. A duration time period of the re-started ashing of the resist by using the neutral activated species is 80 seconds. A sectional shape of the wafer is similar to that shown in FIG. 21B.

Such increase of the pressure in the reaction chamber 7h up to 10 Torr can improve thermal conduction of the silicon wafer 10 and the wafer stage 7k to raise the temperature of the resist in a short time. Hence, the pressure is not limited to 10 Torr and the pressure in the reaction chamber 7h need not be varied if the wafer temperature is increased with much time. Furthermore, if the wafer temperature becomes stable, the pressure may be restored. An example of variation of the pressure is also shown by a dot-dash line in FIG. 22.

After this, like FIG. 21C, introduction of $H_2O$ and $O_2$ via the first and second gas introducing pipes 7e, 7f is terminated. According to such ashing, the resist patterns 13 can be removed without remaining the residue on the surface of the wirings 12a.

In the meanwhile, in the second example, the wafer temperature is controlled by the heater 7m as the way of changing the heating temperature of the silicon wafer 10. However, a following way may be applied to change the temperature of the silicon wafer 10, i.e., the resist.

For instance, the silicon wafer 10 is held by the lift pins over the wafer stage 7k at a distance, like the case shown in FIG. 26A. The ashing of the resist patterns 13 is then commenced by the neutral activated species under this condition. The ashing is temporarily suspended after 20 seconds. Then, as shown in FIG. 26B, the silicon wafer 10 is placed on the wafer stage 7k and then heated at 200° C. The ashing is then started once again under this condition. According to the above, the ashing can also be accomplished without the residue.

The heating structure is not limited to the heater 7m of the wafer stage 7k, and therefore the structure of providing the lamp 9L in FIG. 27 explained in the first example may be adopted, for example.

In order to change the temperature, a way by which the lamp 9L is turned off in the initial stage of the ashing and then the lamp 9L is turned on, or another way bag which a quantity of emitted light of the lamp 9L is decreased in the initial stage and then is increased may be employed selectively.

For the purpose of example, the ashing of the resist patterns 13 is started on the wafer stage 7k and the ashing is then temporarily suspended. The light is irradiated onto the silicon wafer 10 to heat it, and the ashing is then started once again after the temperature of the silicon wafer 10 is stabilized. According to the above, the ashing of the resist patterns 13 can be attained without generation of the residue.

As explained in the first embodiment, if the technique of introducing 100% $H_2O$ into the plasma generating chamber 7d and the technique of lowering the heating temperature in the initial stage of the ashing are combined together, the effect of suppressing corrosion appears remarkably.

(Other Embodiment)

In the above first to third embodiments, before or after the ashing process using the gas including oxygen as a principal component is effected, the step of supplying the neutral activated species which are generated from the plasmanized gas including $H_2O$ more than 30% to the wafer. As the gas other than oxygen included in the ashing process using the gas including oxygen as a principal component, fluorine group gas such as $CF_4$ shown in FIG. 2 may be employed instead of $H_2O$. In that case, such fluorine group gas never has a harmful influence upon the effect of removing Cl by the neutral activated species obtained from the gas including $H_2O$ in excess of 30 flow rate %.

Moreover, the step of supplying the first neutral activated species obtained from the gas including $H_2O$ in excess of 30 flow rate % to the wafer and the step of supplying the second neutral activated species obtained from the gas including oxygen as a principal component may be alternatively repeated plural times respectively.

Figure 28:
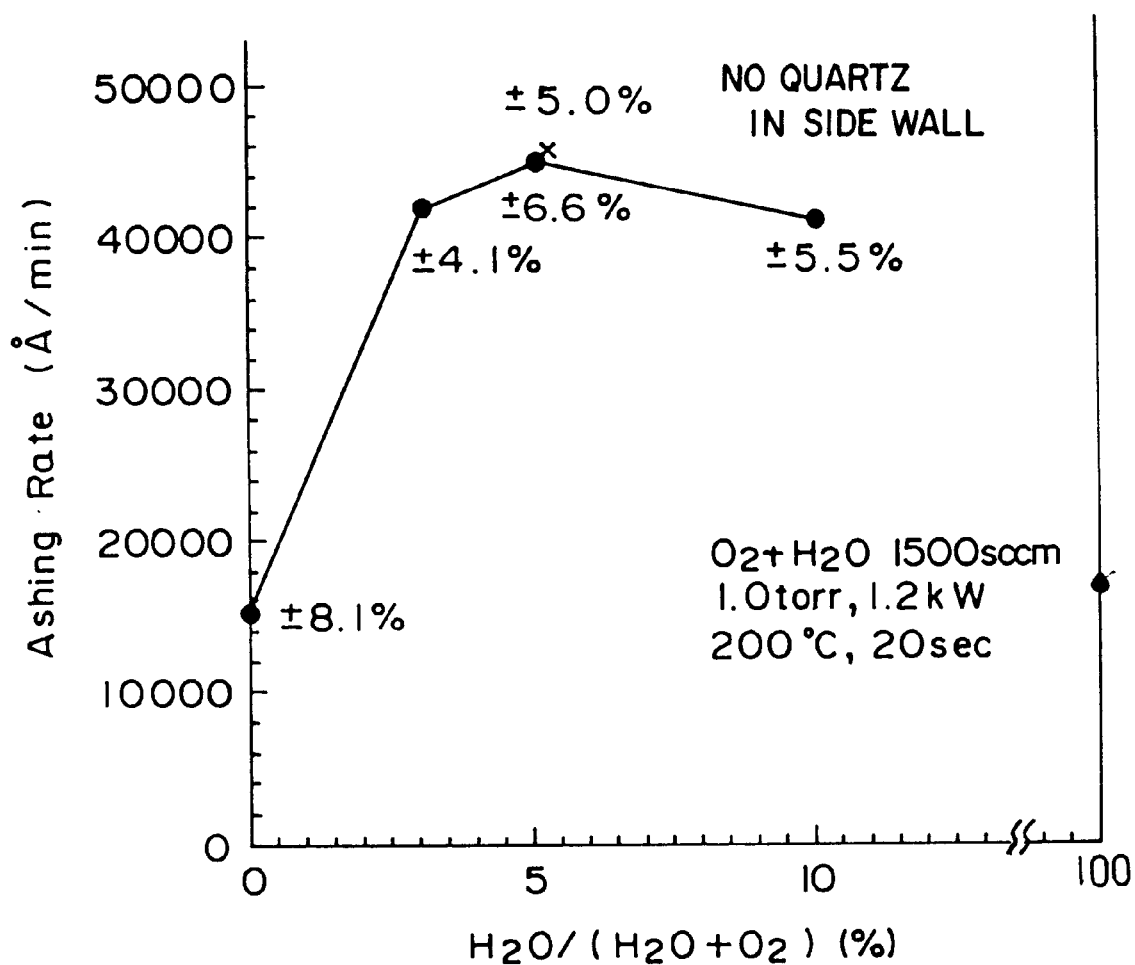
FIG. 28 is a view showing a relationship between a flow rate of water, which is included in a gas including oxygen used in ashing as a principal component, and an ashing rate in the embodiments of the present invention.

During the ashing process which employs the gas including oxygen as a principal component, an ashing rate changes depending upon an amount of $H_2O$ contained in oxygen. As shown in FIG. 28, the ashing rate is increased if the $H_2O$ containing amount is in the range of 3 to 10 flow rate % of a total flow rate of $O_2$ and $H_2O$.

Anyhow, the multi-layered structure made of TiN/AlCuTi/TiN is employed as the wiring pattern in the first and second embodiments, and the structure made of sequentially formed Ti/TiN/AlCuTi/S—Si is employed as the wiring pattern in the second embodiment. However, this does not signify that approaches described in the first, second and third embodiments can be applied only to respective wiring structures and therefore other wiring structure may be employed.

For the purpose of example, in the above literature, Ohtsuka et al., the Japan Society of Applied Physics, Preprint 7-T-4, Autumn 1996, it has been described that the corrosion generation depends on the sheet number of processed wafer after the etching apparatus is rinsed. The wafer conditions (presence of the corrosion, presence of the ashing residue, etc.) after such process depend considerably on the condition of the apparatus. According to the experiments performed by the inventors of this application, the ashing residue sometimes remains in the case of the sample having the structure of TiN/AlCuTi/TiN, but the ashing residue can also be eliminated even if the method explained in the third embodiment is employed.

Further, if the sample having the structure of S—Si/AlCuTi/TiN/Ti is employed, the corrosions are sometimes generated. In such case, the corrosion generation can also be prevented if the method explained in the first embodiment is employed.

Furthermore, if the method explained in the first embodiment and the method explained in the second and third embodiment are employed in combination, the effect of suppressing the corrosion and the effect of preventing the ashing residue can be enhanced.

The wiring structures are limited to the S—Si/AlCTi/TiN/Ti structure, the TiN/AlCuTi/TiN structure, or the above-mentioned film thickness. An Al or Al alloy single-layered film or a multi-layered structure obtained by combining TiN, Ti, sputter Si, or the like with this film may be employed. As the Al alloy, there are Al alloys containing Si, Cu, Ti, Ge, Se, Hf, or the like.

In order to etch Aluminum or Aluminum alloy, the gas including Cl atoms other than $Cl_2$, $BCl_3$ may be employed as the reaction gas. In this case, water soluble chlorine is stuck to the surface of the wirings formed by patterning.

Even if the metal film including Al as a principal component is etched by use of the gas including halogen atoms other than chlorine, there are some cases where corrosion is generated on the surface of the metal film. Processes to be performed in the ashing apparatus, as explained in the first, second and third embodiments, may be applied to suppress the corrosion generation.

In addition, if the metal film not including aluminum as a principal component is etched by the gas including chlorine atoms and thus the corrosion is generated, processes to be performed in the ashing apparatus, as described in the first, second and third embodiments, may be conducted.

Otherwise, even if the corrosion is generated when the metal film not including aluminum as a principal component is etched by the gas including halogen atoms except for chlorine, the corrosion generation of the metal film can be suppressed by placing the wafer in the down-flow area using 100% $H_2O$.

Besides, in the case that excimer laser resist, electron beam resist, etc. other than the above is employed as the resist material, the above-mentioned ashing process may be applied.

In the first, second and third embodiments, the wafer has been placed in the neutral activated species atmosphere located in the downstream of the plasma generating chamber 7d, i.e., the so-called down-flow type ashing apparatus has been employed. However, an apparatus like a plasma ashing apparatus may be employed as the ashing apparatus. In this case, the corrosion generation can also be suppressed by adding the process using $H_2O$ of more than 30 flow rate % to the ashing and further the resist residue can be eliminated by setting the wafer heating temperature to less than 130° C. in the initial stage of the ashing. According to the plasma ashing apparatus, products other than the neutral activated species included in the gas which can be obtained by plasmanizing the $H_2O$ containing gas, and such products are supplied to the wafer.

As a plasma generation method in the ashing apparatus, a method wherein a high frequency (RF) voltage is applied between parallel plates, a method wherein the high frequency voltage is applied to a coil antenna, etc. may be employed in addition to the method using the microwave.

Figure 29:
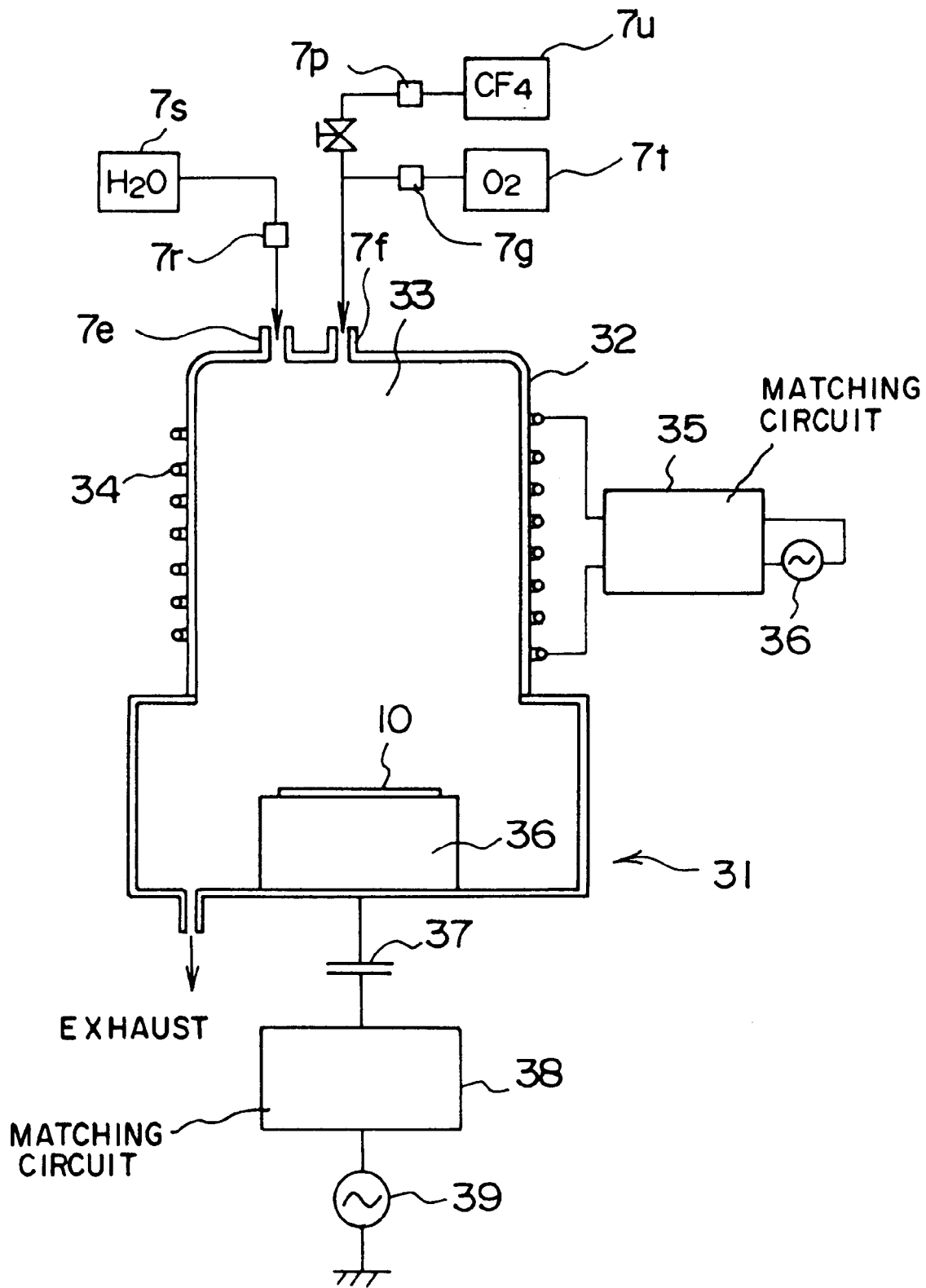
FIG. 29 is a schematic sectional view showing a configuration of a third example of the ashing apparatus for use in the embodiments of the present invention.

For example, as an inductive coupled plasma (ICP) type ashing apparatus having the coil antenna, there is an ashing apparatus shown in FIG. 29. A quartz bell jar 32 of an ashing apparatus 31 in FIG. 29 corresponds to the plasma generating chamber 7d. A coil antenna 34 is wound around the bell jar 32. A high frequency power supply of 13.56 MHZ is connected to the antenna 34 via a matching circuit 35. In addition, a wafer stage 36 positioned at the bottom of a plasma generating chamber 33 is connected to a wafer bias power supply 39 of 100 kHz to 13.56 MHZ via a blocking capacitor 37 and a matching circuit 38.

In the ashing apparatus, a first gas introducing pipe 40a and a second gas introducing pipe 40b are connected to a top surface of the bell jar 32 and an exhausting pipe 41 is connected to a bottom surface of the bell jar 32. In FIG. 28, like references in FIG. 2 denote like parts or elements.

Upon ashing the resist in such ashing apparatus 31, a step of removing water soluble chlorine by plasmanizing only $H_2O$ is included, or else a step of setting the wafer heating temperature to 130° C. or less in the initial stage of ashing is included.

In this manner, although there are various ashing apparatuses, it is preferable to employ the down-flow type ashing apparatus if the wirings and the insulating film beneath the wirings should be less damaged.

The corrosion of the wirings is difficult to be generated under the condition that the wafer is not exposed to the moisture containing gas from start of the etching to end of the ashing. Therefore, if such condition is satisfied, it does not matter that processes described above in the first, second and third embodiments are carried out by a single apparatus or plural apparatuses.

As discussed above, according to the present invention, after the metal film including aluminum on the wafer is patterned with the use of the chlorine including gas and the resist patterns, the wafer is placed in the atmosphere including the gas which is obtained by plasmanizing the gas including water at a rate of 30 flow rate % before or after or before and after the resist patterns are ashed by plasmanizing the oxygen mixed gas. Therefore, chlorine on the wafer can be removed by the gas obtained from the water plasma. Thereby, the corrosion generation on the wirings made of the metal film can be prevented and also removal of the deteriorated layer formed on the surface of the resist patterns can be performed easily.

The more the gas containing water includes water, the higher the effect of removing chlorine is enhanced. In the case of 100 flow rate %, the effect of removing chlorine becomes conspicuous.

According to another invention, upon ashing the resist patterns, the wafer temperature is set to less than 130° C. at the starting of the ashing and thereafter the wafer temperature is increased up to more than 130° C. Therefore, while suppressing generation of the deteriorated layer formed on the surface of the resist patterns, the surface of the resist patterns can be removed by the ashing process. As a result, generation of the residue of the deteriorated layer of the resist patterns can be prevented and accordingly generation of the trash can be prevented. For this reason, release of chlorine from the wafer cannot be prevented by the resist residue and also generation of corrosion due to chlorine can be suppressed.

Various modifications will become possible for those skilled in the art after receiving the teachings of the present disclosure without departing from the scope thereof.

What is claimed is:

1. A method of manufacturing a semiconductor device including ashing process comprising the steps of:

forming a resist pattern on a metal film made of aluminum or aluminum containing material formed on a wafer including semiconductor;

forming wirings made of said metal film by etching said metal film which is not covered with said resist pattern by use of an etching gas;

exposing said resist pattern, said wirings, and their peripheral regions to a first atmosphere which includes a first product obtained by making a plasma of a gas containing water at a rate of more than 30 flow rate %;

ashing, after said exposing step, said resist pattern in a second atmosphere which includes a second product obtained by making a plasma of an oxygen mixed gas which contains an oxygen gas as a principal component; and supplying, after said ashing step, a resist releasing liquid to said wirings after said ashing in said second atmosphere.

2. A method of manufacturing a semiconductor device including ashing process according to claim 1, wherein said etching gas is made of a chlorine containing gas.

3. A method of manufacturing a semiconductor device including ashing process according to claim 1, wherein gaseous water is contained in said oxygen mixed gas at less than 30 flow rate %.

4. A method of manufacturing a semiconductor device including ashing process according to claim 1, wherein said gas containing water at a rate of more than 30 flow rate % is made of water of 100 flow rate %.

5. A method of manufacturing a semiconductor device including ashing process according to claim 1, wherein said step of exposing said resist pattern, said wirings, and their peripheral regions to said first atmosphere is conducted before and after said step of ashing said resist pattern in said second atmosphere.

6. A method of manufacturing a semiconductor device including ashing process according to claim 1, wherein a gas mixture of oxygen and water is employed as said oxygen mixed gas.

7. A method of manufacturing a semiconductor device including ashing process according to claim 1, wherein a gas mixture of oxygen and a fluorine containing gas is employed as said oxygen mixed gas.

8. A method of manufacturing a semiconductor device including ashing process according to claim 1, further comprising the step of exposing said wafer to a third atmosphere of less than 1 mTorr other than said first atmosphere and said second atmosphere for 20 seconds or more after said step of exposing said resist pattern, said wirings, and their peripheral regions to said first atmosphere and said step of ashing said resist pattern in said second atmosphere are completed.

9. A method of manufacturing a semiconductor device including ashing process according to claim 1, wherein said first atmosphere is constituted only of neutral activated particles in said first product and said second atmosphere is constituted only of neutral activated particles in said second product.

10. A method of manufacturing a semiconductor device including ashing process according to claim 1, wherein no halogen is contained in said first product.

11. A method of manufacturing a semiconductor device including ashing process according to claim 1, wherein said step of exposing said resist pattern by said first product and said step of ashing said resist pattern by said second product are conducted plural times alternatively.

12. A method of manufacturing a semiconductor device including ashing process according to claim 1, wherein said step of ashing said resist pattern is conducted at a location to which said wafer is carried without being exposed to an atmosphere after said step of forming said resist pattern on said metal film.

13. A method of manufacturing a semiconductor device including ashing process comprising the steps of:

forming a resist pattern on a metal film made of aluminum or aluminum containing material formed on a wafer including semiconductor;

forming wirings made of said metal film by etching said metal film which is not covered with said resist pattern by use of an etching gas;

ashing a surface layer of said resist pattern by contacting said resist pattern to an atmosphere of product obtained by use of plasma of a water containing gas including water and optionally oxygen while setting a temperature of said wafer at less than 130° C. initially by heating; and further ashing said resist pattern in an atmosphere of product obtained by use of plasma of an oxygen containing gas including oxygen gas as a principal component while raising the temperature of said wafer higher than 130° C.

14. A method of manufacturing a semiconductor device including ashing process according to claim 13, wherein said wafer is placed on a wafer stage and said heating is conducted by a heater arranged beneath a wafer stage in said atmosphere.

15. A method of manufacturing a semiconductor device including ashing process according to claim 14, wherein increase in said temperature of said wafer is conducted by increasing said temperature of said wafer higher than 130° C. by virtue of bringing said wafer into contact with said wafer stage after said wafer is placed at a distance from said wafer stage so as to set heating of said wafer temperature at less than 130° C.

16. A method of manufacturing a semiconductor device including ashing process according to claim 13, wherein heating of said wafer by said heating means is conducted by irradiating a light to said wafer.

17. A method of manufacturing a semiconductor device including ashing process according to claim 16, wherein increase in said temperature of said wafer is conducted by increasing an irradiation amount of said light or by commencing irradiation of said light from a condition wherein irradiation of said light is suspended.

18. A method of manufacturing a semiconductor device including ashing process according to claim 13, wherein a pressure of said atmosphere is increased temporarily or continuously upon increasing said temperature of said wafer.

19. A method of manufacturing a semiconductor device including ashing process according to claim 13, wherein said atmosphere is an atmosphere composed of only neutral activated species in a product obtained by making a plasma of said water containing gas.

20. A method of manufacturing a semiconductor device including ashing process according to claim 13, wherein no halogen is included in said water containing gas.

21. A method of manufacturing a semiconductor device including ashing process according to claim 13, wherein a water content in said water containing gas is set at a range of 30 to 100 flow rate % at a time when a temperature of said wafer is equal to or lower than 130° C., and said water content in said oxygen containing gas is set at a range of less than 30 flow rate % at a time when a temperature of said wafer is higher than 130° C.

* * * * *